(12) United States Patent
Ha et al.

(10) Patent No.: US 9,880,609 B2
(45) Date of Patent: *Jan. 30, 2018

(54) POWER MANAGEMENT

(71) Applicant: MICRON TECHNOLOGY, INC., Boise, ID (US)

(72) Inventors: Chang Wan Ha, San Ramon, CA (US); Hang Tian, San Jose, CA (US); Jong Kang, Pleasanton, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/226,505

(22) Filed: Aug. 2, 2016

(65) Prior Publication Data
US 2016/0342187 A1 Nov. 24, 2016

Related U.S. Application Data

(63) Continuation of application No. 14/146,447, filed on Jan. 2, 2014, now Pat. No. 9,417,685.
(Continued)

(51) Int. Cl.
*G06F 1/00* (2006.01)
*H04L 12/28* (2006.01)
(Continued)

(52) U.S. Cl.
CPC ............... *G06F 1/324* (2013.01); *G06F 1/12* (2013.01); *G06F 1/3237* (2013.01);
(Continued)

(58) Field of Classification Search
None
See application file for complete search history.

(56) References Cited

U.S. PATENT DOCUMENTS 6,100,752 A * 8/2000 Lee .................... H02M 3/07 327/536
6,205,084 B1 3/2001 Akaogi
(Continued)

FOREIGN PATENT DOCUMENTS

JP 62297963 A 12/1987
JP 10190699 A 7/1998
(Continued)

OTHER PUBLICATIONS

Japan Notice of Allowance for JP Application No. 2015-551825, dated Jun. 20, 2017 (1 Pg.).
(Continued)

*Primary Examiner* — Hyun Nam
(74) *Attorney, Agent, or Firm* — Dicke, Billig & Czaja, PLLC

(57) ABSTRACT

Apparatus facilitating peak power management are useful in mitigating excessive current levels within a multi-die package. For example, such apparatus may include an array of memory cells, a controller for performing an access operation on the array of memory cells, an input buffer having an input connected to a clock signal line and having an output, a clock generator for generating an internal clock signal, an output buffer having an input connected to receive the internal clock signal and having an output connected to the clock signal line, and a counter for counting pulses of a particular clock signal selected from a group consisting of the internal clock signal from the clock generator and an external clock signal from the output of the input buffer.

20 Claims, 23 Drawing Sheets

Related U.S. Application Data

(60) Provisional application No. 61/749,768, filed on Jan. 7, 2013.

(51) Int. Cl.
*G06F 1/32* (2006.01)
*G11C 7/10* (2006.01)
*G11C 7/22* (2006.01)
*G06F 1/12* (2006.01)
*G06F 13/16* (2006.01)

(52) U.S. Cl.
CPC ........ *G06F 1/3275* (2013.01); *G06F 13/1673* (2013.01); *G11C 7/1015* (2013.01); *G11C 7/222* (2013.01); *Y02B 60/1221* (2013.01); *Y02B 60/1225* (2013.01); *Y02B 60/1228* (2013.01)

(56) References Cited

U.S. PATENT DOCUMENTS

| | | | |
|---|---|---|---|
| 6,208,655 B1* | 3/2001 | Hodgins | H04L 12/40013 370/397 |
| 6,417,705 B1* | 7/2002 | Tursi | H03K 19/00384 326/82 |
| 7,701,764 B2 | 4/2010 | Nguyen | |
| 8,248,881 B2 | 8/2012 | Roohparvar | |
| 8,576,652 B2 | 11/2013 | Koshizuka | |
| 2003/0053439 A1* | 3/2003 | Abe | H04B 7/2681 370/347 |
| 2009/0103388 A1* | 4/2009 | Jones | G11C 29/26 365/230.03 |
| 2011/0173462 A1* | 7/2011 | Wakrat | G06F 1/26 713/300 |
| 2012/0221880 A1 | 8/2012 | Kim et al. | |
| 2012/0290864 A1 | 11/2012 | Seroff | |
| 2012/0331282 A1 | 12/2012 | Yurzola et al. | |
| 2013/0339571 A1* | 12/2013 | Cernea | H01L 45/1608 711/102 |
| 2014/0195734 A1* | 7/2014 | Ha | G06F 1/3237 711/114 |

FOREIGN PATENT DOCUMENTS

| | | |
|---|---|---|
| JP | 11127104 A | 5/1999 |
| JP | 2004-327474 A | 11/2004 |
| JP | 2012-113748 A | 6/2012 |
| WO | 1994028644 | 12/1994 |

OTHER PUBLICATIONS

Korean Office Action for KR Application No. 10-2017-7003137, dated Jun. 29, 2017 (3 Pgs.).

Japan Office Action for JP Application No. 2015-551825, dated Sep. 20, 2016 (5 pages).

* cited by examiner

POWER MANAGEMENT

RELATED APPLICATIONS

This Application is a Continuation of U.S. application Ser. No. 14/146,447, titled "POWER MANAGEMENT," filed Jan. 2, 2014, now U.S. Pat. No. 9,417,685 issued on Aug. 16, 2016, which is commonly assigned and incorporated herein by reference. U.S. application Ser. No. 14/146,447 is a non-provisional of U.S. Provisional Patent Application Ser. No. 61/749,768, filed Jan. 7, 2013 and titled, "POWER MANAGEMENT," which is commonly assigned and incorporated by reference herein in its entirety.

TECHNICAL FIELD

The present disclosure relates generally to memory and, in particular, in one or more embodiments, the present disclosure relates to apparatus utilizing a wrap-around counter in power management.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is often referred to as writing) of charge storage structures (e.g., floating gates or charge traps) or other physical phenomena (e.g., phase change or polarization), determine the data value of each cell. Common uses for flash memory include personal computers, personal digital assistants (PDAs), digital cameras, digital media players, cellular telephones, solid state drives and removable memory modules, and the uses are growing.

Power consumption is often an important consideration in the design and usage of memory devices. Problems may arise when multiple memory devices are operated concurrently. Such problems could include exceeding power consumption specifications and/or availability.

For the reasons stated above, and for other reasons stated below which will become apparent to those skilled in the art upon reading and understanding the present specification, there is a need in the art for alternative methods of managing power, and apparatus to perform such methods.

DETAILED DESCRIPTION

Figure 1:
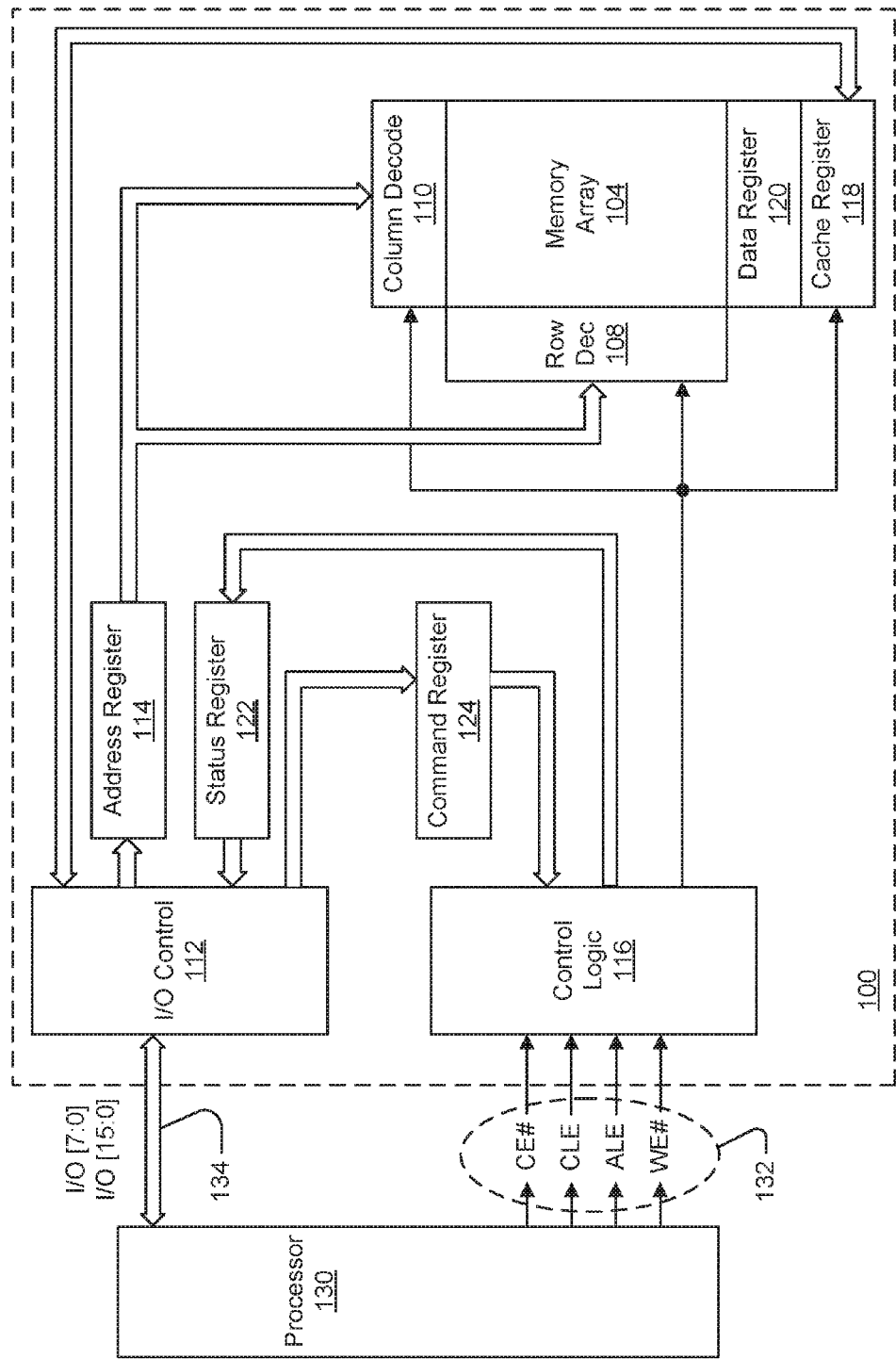
FIG. 1 is a simplified block diagram of a memory device in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

Memory device access operations (e.g., write operations, read operations or erase operations) have varying current, and thus power, demands throughout the operations. Allowing multiple memory devices of an electronic system to proceed with access operations concurrently can exceed power availability, such as when too many devices are performing access operations.

A variety of techniques have been utilized to manage power consumption of memory systems containing multiple memory devices (e.g., dies, modules and/or packages), many of which rely on a memory controller to stagger the activity of the memory devices seeking to avoid performing high power portions of access operations concurrently in more than one memory device. Several of these techniques are discussed in U.S. Provisional Patent Application Ser. No. 61/749,768 (see, e.g., pages 12-17).

Various embodiments described herein facilitate power management among multiple apparatus without external controller intervention. In multi-die operations with peak power management, each die may be given the opportunity to be able to participate in a sequence of operations. Even if a new write or read operation starts while certain dies are already in the process of programming or reading, the peak power control sequence can be maintained, such that the dies can be given the opportunity to proceed within that sequence. In various embodiments, one die of a multi-die package can create a clock for maintaining die priority order between multiple dies, and the other dies can share this clock. A clock enable signal can be shared between these dies to indicate when one of the dies is in a high-current demand portion of an operation, to stop (e.g., disable) the clock when one of the dies is in a high-current demand portion of an operation, and to resume (e.g., enable) the clock when none of the dies is in a high-current demand portion of an operation.

FIG. 1 is a simplified block diagram of a first apparatus, in the form of a memory device 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, cellular telephones and the like. The processor 130 may be a memory controller or other external host device.

Memory device 100 includes an array of memory cells 104 logically arranged in rows and columns. Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

An internal controller (e.g., control logic 116) controls access to the array of memory cells 104 in response to the commands and generates status information for the external processor 130, i.e., control logic 116 is configured to perform access operations. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a write operation (e.g., program operation), data is passed from the cache register 118 to data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
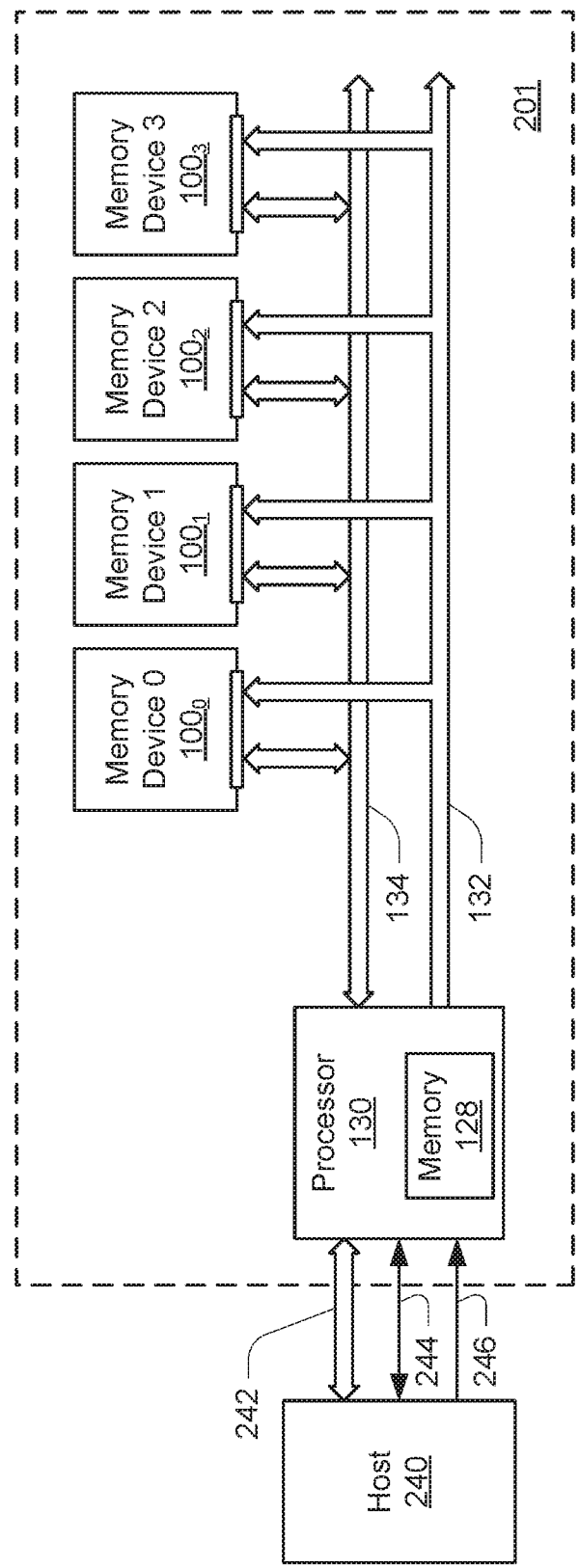
FIG. 2 is a simplified block diagram of a memory module in communication with a host as part of an electronic system, according to another embodiment.

A given processor 130 may be in communication with one or more memory devices 100, e.g., dies. FIG. 2 is a simplified block diagram of an apparatus in the form of a memory module 201 in communication with a host 240 as part of an electronic system, according to another embodiment. Memory devices 100 and processor 130 may be as described with reference to FIG. 1. Although memory module (e.g., package) 201 is depicted with four memory devices 100 (e.g., dies), memory module could have one or more memory devices 100.

Because processor 130 (e.g., a memory controller) is between the host 240 and the memory devices 100, communication between the host 240 and the processor 130 may involve different communication links than those used between the processor 130 and the memory devices 100. For example, the memory module 201 may be an Embedded MultiMediaCard (eMMC) of a solid state drive (SSD). In accordance with existing standards, communication with an eMMC may include a data link 242 for transfer of data (e.g., an 8-bit link), a command link 244 for transfer of commands and device initialization, and a clock link 246 providing a clock signal for synchronizing the transfers on the data link 242 and command link 244. The processor 130 may handle many activities autonomously, such as error correction, management of defective blocks, wear leveling and address translation.

Figure 3:
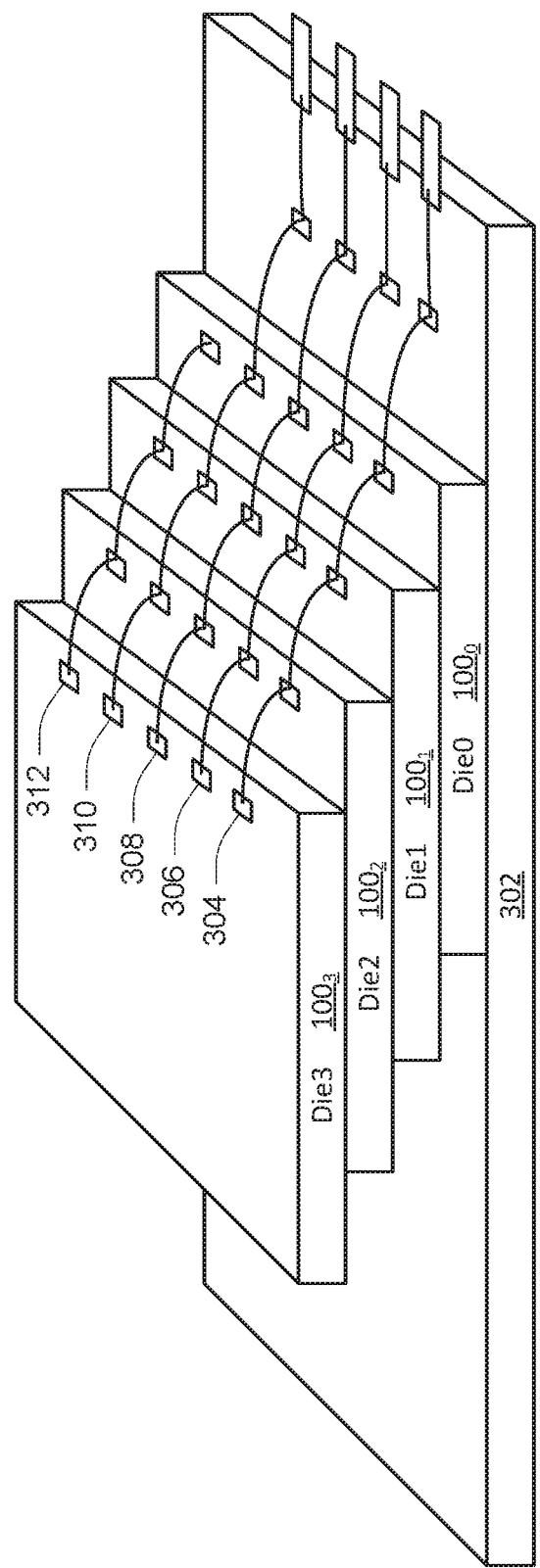
FIG. 3 is a perspective view of a representation of a multi-die package according to an embodiment.

FIG. 3 is a perspective view of a representation of a multi-die package 302 according to an embodiment. Multi-die package 302 is depicted to include four dies 100 (i.e., $100_0$-$100_3$ corresponding to Die0-Die3), although multi-die packages could have fewer or more such dies. Each of the dies 100, as well as the package 302, may include a node 304 (e.g., a pad) for providing a ready/busy control signal RB#. The ready/busy control signal may be used to indicate to a host device or to the dies 100 in the multi-die package 302 whether one or more of the dies 100 are busy performing an operation. As such, the nodes 304 may be commonly connected. Each of the dies 100, as well as the package 302, may include a node 306 for providing input/output (I/O) signals. Note that each node 306 may represent more than one physical node, e.g., one pad for each signal of the I/O bus 134 of FIG. 1 for each of the dies 100 and the multi-package 302. The nodes 306 may be commonly connected. Each of the dies 100, as well as the package 302, may include a node 308 for providing control signals. Note that each node 308 may represent more than one physical node, e.g., one pad for each signal of the control link 132 of FIG. 1 for each of the dies 100 and the multi-package 302. The nodes 308 may be commonly connected. Each of the dies 100, as well as the package 302, may include a node 310 for providing a clock enable signal HC#. The clock enable signal HC# may be shared between the dies 100 and with a host device to indicate when one of the dies 100 is in a peak current demand portion of an operation. The nodes 310 may be commonly connected. Each of the dies 100 may include a node 312 for providing an internal clock signal ICLK. The clock signal may be shared between the dies 100. Use of the clock signal will be described with reference to subsequent figures. The nodes 312 may be commonly connected among the dies 100, but no connection to the multi-die package is needed.

Figure 4:
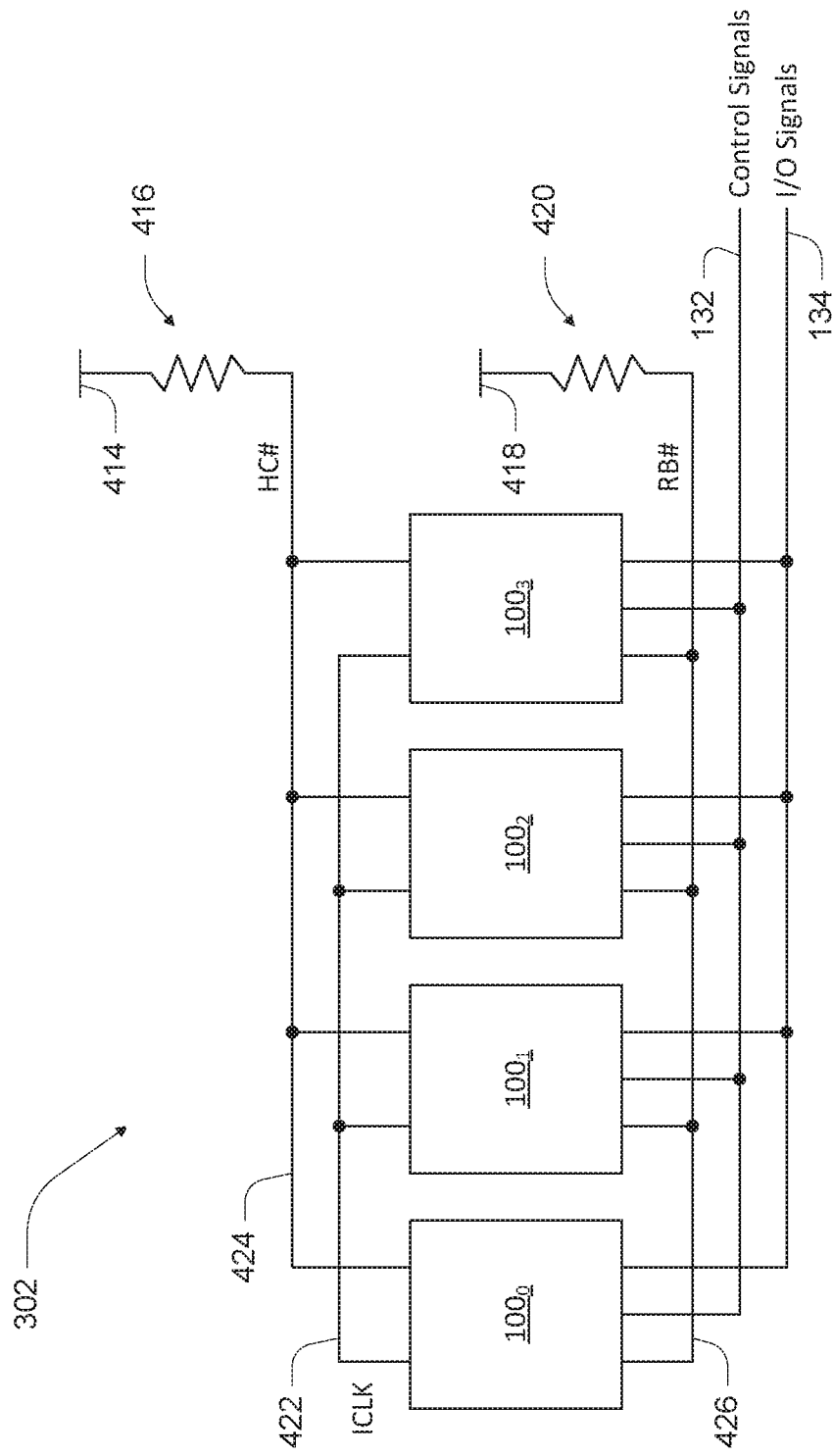
FIG. 4 is a schematic representation of a multi-die package according to an embodiment.

FIG. 4 is a schematic representation of the multi-die package 302 including four dies 100 (e.g., $100_0$-$100_3$) according to an embodiment. The clock signal ICLK is commonly shared between the dies 100 through a clock signal line 422. The clock enable signal HC# is commonly shared between the dies 100 through a clock enable signal line 424. The clock enable signal HC# may be normally pulled to a particular state (e.g., pulled high), such as by connecting the clock enable signal line 424 to a voltage supply node 414, coupled to receive a supply voltage such as Vcc, through a resistor 416, sometimes collectively referred to as a weak pull-up resistor, or simply a pull-up resistor.

The ready/busy control signal RB# is commonly shared between the dies 100 through a ready/busy control signal line 426. The ready/busy control signal RB# may be normally pulled to a particular state (e.g., pulled high), such as by connecting the ready/busy control signal line 426 to a voltage supply node 418 through a resistor 420. Each of the dies 100 is further commonly connected to a control link 132 and to an I/O bus 134.

Figure 5:
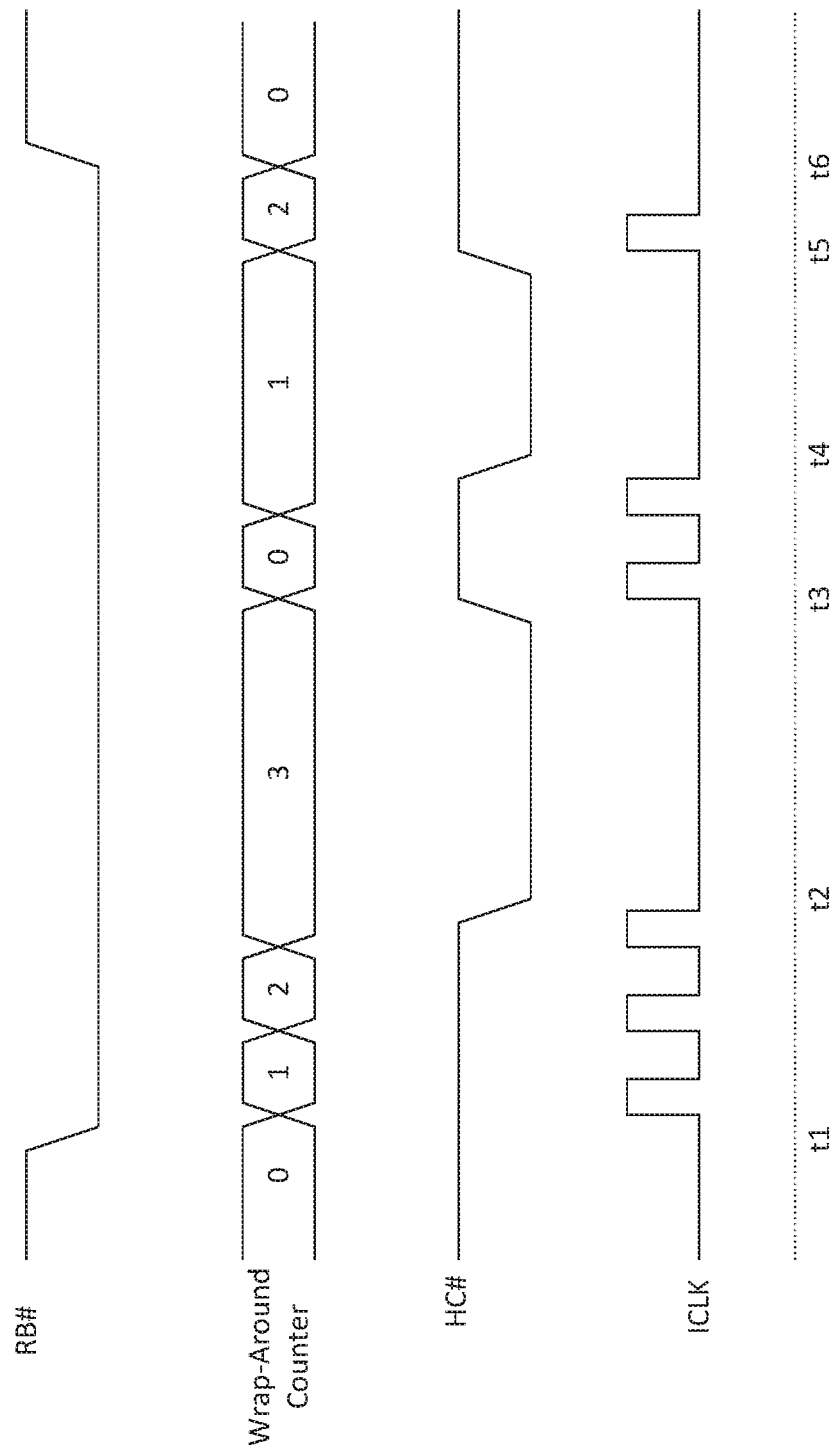
FIG. 5 is one example of a timing diagram showing operation of a multi-die package of the type depicted in FIG. 4 according to an embodiment.

FIG. 5 is one example of a timing diagram showing operation of a multi-die package of the type depicted in FIG. 4 according to an embodiment. In this example, access operations in each die may pause at one or more designated points prior to entering a high-current demand period, and will check if they can enter a high-current demand period only when a value of a wrap-around counter matches a counter number assigned to that die. If the check determines that the value of a wrap-around counter matches a counter number assigned to a die waiting to enter its high-current demand period, then the generation of clock signal ICLK will be paused, thereby pausing the wrap-around counter. As a result, remaining dies can be prevented from entering their high-current demand periods as the wrap-around counter can be maintained at the value corresponding to the die that is currently performing its high-current demand portion.

In the example of FIG. 5, dies $100_0$/$100_1$/$100_2$/$100_3$ may be assigned the counter numbers 0/1/2/3, respectively. Each die's counter number may be assigned by MDS pins or during an assignment step while setting features of the die during an initialization of that die. Peak power management might be utilized, for example, during write operations, read operations and erase operations, where periods of high current demand may be common. For example, precharging access lines for an access operation, e.g., a write operation or a read operation, may be deemed a high-current demand portion of the access operation. Other access operations may also benefit from such peak power management. As used herein, a high-current demand does not refer to any particular current level. Instead, the term will refer to a period of operation of a die where it is desired, during that period, to restrict current usage of other dies commonly sharing the clock signal ICLK.

Referring to FIG. 5, at time t1, the ready/busy control signal RB# transitions to a logic low, indicating that at least one of the dies is busy performing an operation. With the clock enable signal HC# at a logic high, the internal clock signal ICLK begins. A wrap-around counter (described in more detail later) responsive to the clock signal ICLK begins counting. Prior to time t2, die $100_3$ may reach a designated point in an access operation prior to entering a period of high current demand for that die, and that access operation may be paused as a result. For example, a controller of the die might be configured (e.g., coded) to cause the access operation to pause at one or more designated points prior to performing a portion of the access operation that is deemed to be a high-current demand portion, and to wait for a subsequent indication that it can proceed. When the wrap-around counter reaches a value corresponding to the counter number assigned to die $100_3$ at time t2, the controller in die $100_3$, assuming its access operation is paused at one of its designated points waiting to perform a high-current demand portion, will transition the clock enable signal HC# to a logic low, thereby pausing the generation of clock signal ICLK and, as a result, the wrap-around counter. Responsive to die $100_3$ completing the high-current demand portion of the operation at time t3, the controller in die $100_3$ will transition the clock enable signal HC# to a logic high, thereby resuming the generation of clock signal ICLK and, as a result, the wrap-around counter. Similarly, prior to time t4, die $100_1$ may reach a designated point in an access operation prior to entering a period of high current demand for that die, and its access operation may be paused as a result. When the wrap-around counter reaches a value corresponding to the counter number assigned to die $100_1$ at time t4, the controller in die $100_1$, assuming its access operation is paused at one of its designated points waiting to perform a high-current demand portion, will transition the clock enable signal HC# to a logic low, thereby pausing the generation of clock signal ICLK and, as a result, the wrap-around counter. Responsive to die $100_1$ completing the high-current demand portion of the operation at time t5, the controller in die $100_1$ will transition the clock enable signal HC# to a logic high, thereby resuming the generation of clock signal ICLK and, as a result, the wrap-around counter. At time t6, the ready/busy control signal RB# transitions to a logic high, indicating that none of the dies $100_0$-$100_3$ are busy performing any access operation. This ready/busy control signal RB# may be used to not only stop generation of the clock signal ICLK, but also to reset the value of the wrap-around counter.

It is noted that a controller might be configured to cause the transitions of the ready/busy control signal RB# and the clock enable signal HC# as described. For example, the controller might be configured to cause an access operation to cause circuitry of the die to transition the ready/busy control signal RB# at the beginning of the access operation, and cause it to be released by the die at the end of the access operation. Similarly, the controller might be configured to cause the access operation to cause circuitry of the die to transition the clock enable signal HC# in response to a match between the counter value and the assigned counter number when that access operation is paused at one of its designated points prior to a high-current demand period, and cause it to be released when a portion of the access operation corresponding to the high-current demand period is completed. It is further noted that while a controller may cause action within its respective die to cause a transition of the ready/busy control signal RB#, the ready/busy control signal RB# may already have the logic level sought by the controller due to action in some other die sharing the ready/busy control signal RB#.

Figure 6:
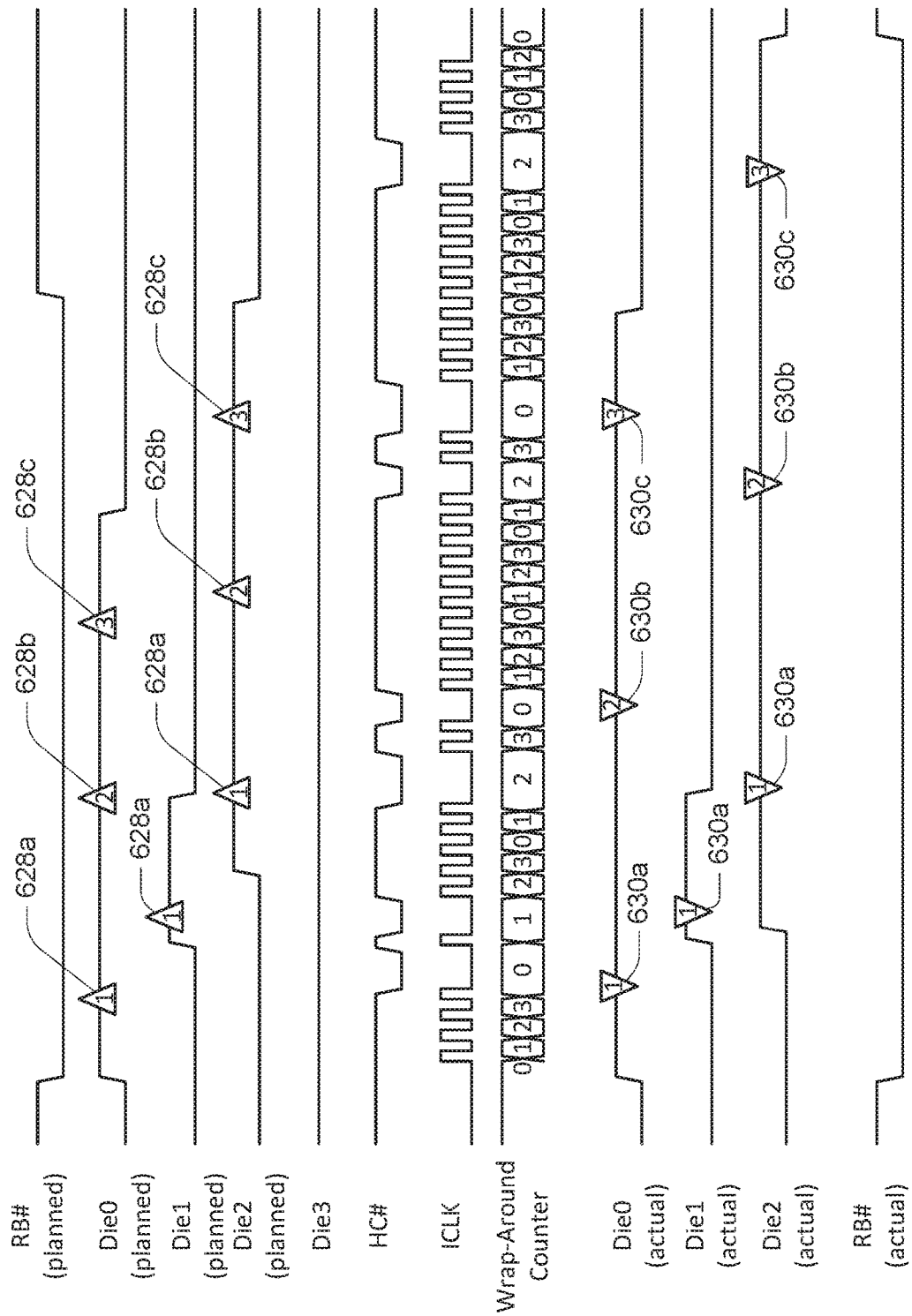
FIG. 6 is another example of a timing diagram showing operation of a multi-die package of the type depicted in FIG. 4 according to an embodiment.

FIG. 6 is another example of a timing diagram showing operation of a multi-die package of the type depicted in FIG. 4 according to an embodiment. In this example as well, dies $100_0$/$100_1$/$100_2$/$100_3$ may be assigned the counter numbers 0/1/2/3, respectively. FIG. 6 depicts an example where an access operation is initiated in Die0, followed by the initiation of an access operation in Die1, then followed by the initiation of an access operation in Die2. Die3 shows no planned operations during this example. The access operation of Die0 has three designated points 628 for pausing the access operation until the value of the wrap-around counter matches the counter number of Die0, i.e., 628a, 628b and 628c. The access operation of Die1 has one designated point 628 for pausing the access operation until the value of the wrap-around counter matches the counter number of Die1, i.e., point 628a. The access operation of Die2 has three designated points 628 for pausing the access operation until the value of the wrap-around counter matches the counter number of Die2, i.e., 628a, 628b and 628c. The designated points 628 represent points within their respective access operation prior to entering a high-current demand portion of that access operation. The access operations of Die0 and Die2 may be the same access operations, for example, and may thus have the same designated points 628 (i.e., designated points occurring at the same point of an access operation without regard for the die upon which the access operation is proceeding). For example, the access operations of Die0 and Die2 may be programming operations, while the access operation of Die1 may be a read operation. In FIG. 6, the timing traces for the access operations of Die0, Die1 and Die2 and the ready/busy control signal RB# labeled "(planned)" represent a planned timing, i.e., how the access operations might proceed if each die were allowed to proceed with its access operation without regard to current demands. Similarly, the timing traces for the access operations of Die0, Die1 and Die2 and the ready/busy control signal RB# labeled "(actual)" represent an expected timing, i.e., how the access operations might proceed when dies pause their access operations such as described with reference to FIG. 5. Thus, while peak power management is facilitated by methods described herein, the actual timing of access operations may exceed the planned timing of those operations as a result.

In conjunction with FIG. 6, the access operation of Die0 will be paused upon reaching its designated point 628a, and will be resumed when the value of the wrap-around counter reaches the matching counter value, i.e., 0. When the values match, the clock enable signal HC# will be transitioned (e.g., pulled down) in Die0 to a logic low to stop the generation of clock signal ICLK, and thus stop the wrap-around counter as the access operation proceeds at its point 630a. The clock enable signal HC# will then be transitioned (e.g., released) in Die0 to a logic high when the high-current demand portion of the access operation corresponding to its designated point 628a has been completed, allowing the clock signal ICLK and the wrap-around counter to resume. The access operation of Die0 will again be paused upon reaching its designated point 628b, and will be resumed when the value of the wrap-around counter reaches the matching counter value, i.e., 0. When the values match, the clock enable signal HC# will be transitioned (e.g., pulled down) in Die0 to a logic low to stop the generation of clock signal ICLK, and thus stop the wrap-around counter as the access operation proceeds at its point 630b. The clock enable signal HC# will then be transitioned (e.g., released) in Die0 to a logic high when the high-current demand portion of the access operation corresponding to its designated point 628b has been completed, allowing the clock signal ICLK and the wrap-around counter to resume. And the access operation of Die0 will again be paused upon reaching its designated point 628c, and will be resumed when the value of the wrap-around counter reaches the matching counter value, i.e., 0. When the values match, the clock enable signal HC# will be transitioned (e.g., pulled down) in Die0 to a logic low to stop the generation of clock signal ICLK, and thus stop the wrap-around counter as the access operation proceeds at its point 630c. The clock enable signal HC# will then be transitioned (e.g., released) in Die0 to a logic high when the high-current demand portion of the access operation corresponding to its designated point 628c has been completed, allowing the clock signal ICLK and the wrap-around counter to resume.

The access operation of Die1 will be paused upon reaching its designated point 628a, and will be resumed when the value of the wrap-around counter reaches the matching counter value, i.e., 1. When the values match, the clock enable signal HC# will be transitioned (e.g., pulled down) in Die1 to a logic low to stop the generation of clock signal ICLK, and thus stop the wrap-around counter as the access operation proceeds at its point 630a. The clock enable signal HC# will then be transitioned (e.g., released) in Die1 to a logic high when the high-current demand portion of the access operation corresponding to its designated point 628a has been completed, allowing the clock signal ICLK and the wrap-around counter to resume.

The access operation of Die2 will be paused upon reaching its designated point 628a, and will be resumed when the value of the wrap-around counter reaches the matching counter value, i.e., 2. When the values match, the clock enable signal HC# will be transitioned (e.g., pulled down) in Die2 to a logic low to stop the generation of clock signal ICLK, and thus stop the wrap-around counter as the access operation proceeds at its point 630a. The clock enable signal HC# will then be transitioned (e.g., released) in Die2 to a logic high when the high-current demand portion of the access operation corresponding to its designated point 628a has been completed, allowing the clock signal ICLK and the wrap-around counter to resume. The access operation of Die2 will again be paused upon reaching its designated point 628b, and will be resumed when the value of the wrap-around counter reaches the matching counter value, i.e., 2. When the values match, the clock enable signal HC# will be transitioned (e.g., pulled down) in Die2 to a logic low to stop the generation of clock signal ICLK, and thus stop the wrap-around counter as the access operation proceeds at its point 630b. The clock enable signal HC# will then be transitioned (e.g., released) in Die2 to a logic high when the high-current demand portion of the access operation corresponding to its designated point 628b has been completed, allowing the clock signal ICLK and the wrap-around counter to resume. And the access operation of Die2 will again be paused upon reaching its designated point 628c, and will be resumed when the value of the wrap-around counter reaches the matching counter value, i.e., 2. When the values match, the clock enable signal HC# will be transitioned (e.g., pulled down) in Die2 to a logic low to stop the generation of clock signal ICLK, and thus stop the wrap-around counter as the access operation proceeds at its point 630c. The clock enable signal HC# will then be transitioned (e.g., released) in Die2 to a logic high when the high-current demand portion of the access operation corresponding to its designated point 628c has been completed, allowing the clock signal ICLK and the wrap-around counter to resume.

In the foregoing manner, concurrent high-current demand periods can be mitigated (e.g., eliminated) by pausing access operations at designated points for each die, proceeding with an access operation for a particular die when a wrap-around counter value matches a designated counter number assigned to that die, and stopping the wrap-around counter while that die is busy with a high-current demand portion of the access operation. Although concurrent high-current demand periods are avoided, the package containing Die0-Die3 will remain busy longer, as can be seen by comparing the timing trace for the planned ready/busy control signal RB# to the timing trace for the actual ready/busy control signal RB#.

Figure 7:
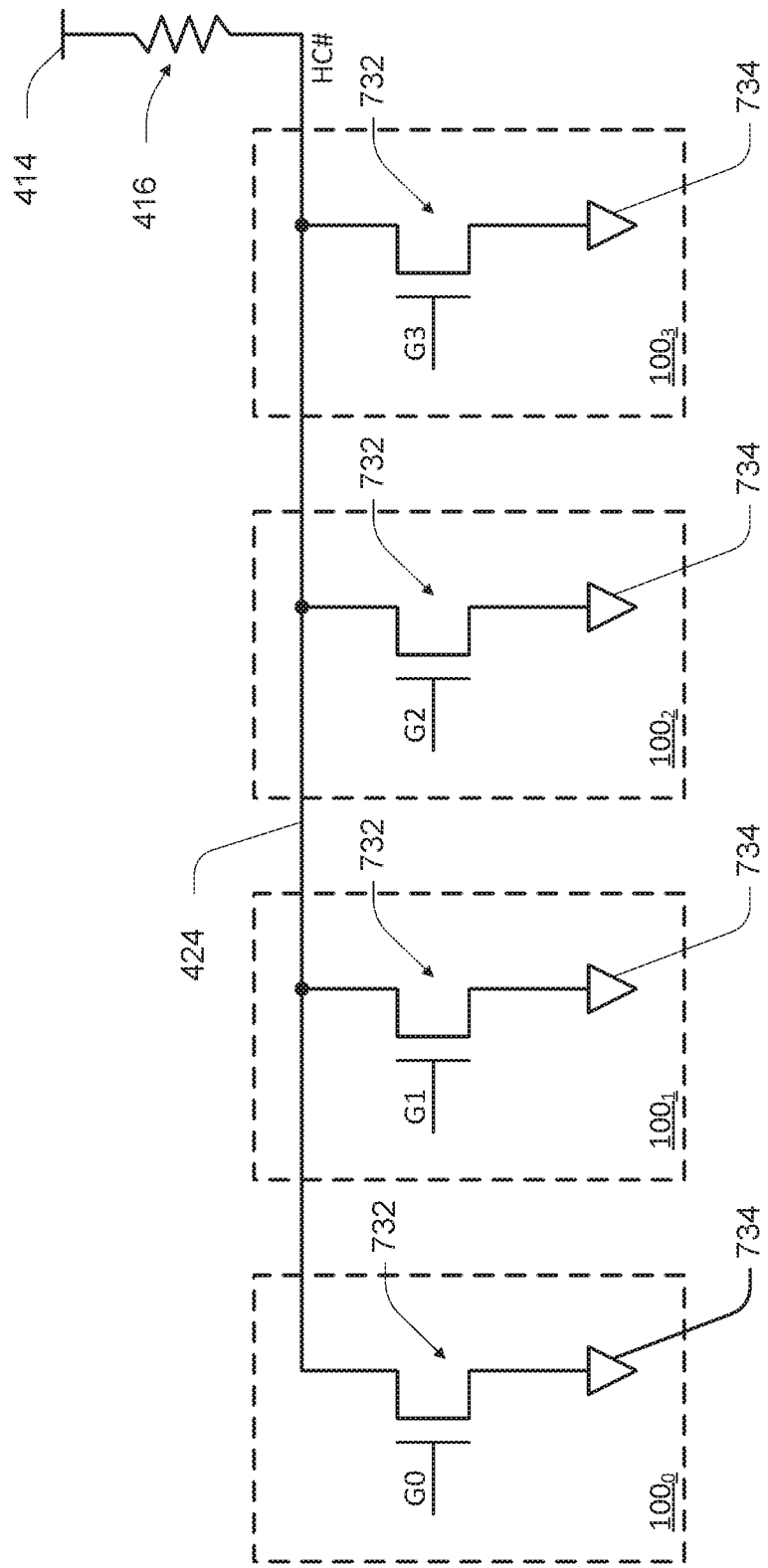
FIG. 7 is a simplified schematic of a circuit for generating a clock enable signal according to an embodiment.

FIG. 7 is a simplified schematic of a circuit for generating the clock enable signal HC# according to an embodiment. As depicted in FIG. 7, four dies $100_0$-$100_3$ commonly share the clock enable signal HC# via clock enable signal line 424. The clock enable signal HC# may be normally pulled to a logic high using voltage supply node 414 and resistor 416, for example. For each of the dies $100_0$-$100_3$, another voltage supply node, such as reference potential node 734 coupled to receive a reference potential, such as a ground or Vss, may be selectively connected to the clock enable signal line 424 through a switch, e.g., a transistor 732, each having a control gate coupled to receive a control signal. For example, die $100_0$ may have the control gate of its transistor 732 coupled to receive the control signal G0, die $100_1$ may have the control gate of its transistor 732 coupled to receive the control signal G1, die $100_2$ may have the control gate of its transistor 732 coupled to receive the control signal G2, and die $100_3$ may have the control gate of its transistor 732 coupled to receive the control signal G3. These control signals are generated (e.g., by the controllers of the dies) to activate their respective transistor 732 when their respective die 100 has entered a high-current demand portion of an access operation, e.g., in response to a counter value of a wrap-around counter matching an assigned counter value for that die 100 while the access operation of that die 100 is paused at one of the designated points. As an example, the control signals for the gates of transistors 732 may be normally logic low to deactivate the depicted n-type field-effect transistor (n-FET), and may transition to a logic high during periods of high current demand for their respective die 100. As such, when a transistor 732 is activated, the voltage level of the clock enable signal line 424 will be pulled to a logic low, and the voltage level of the clock enable signal line 424 will be pulled back to a logic high when none of the transistors 732 are activated.

Figure 8:
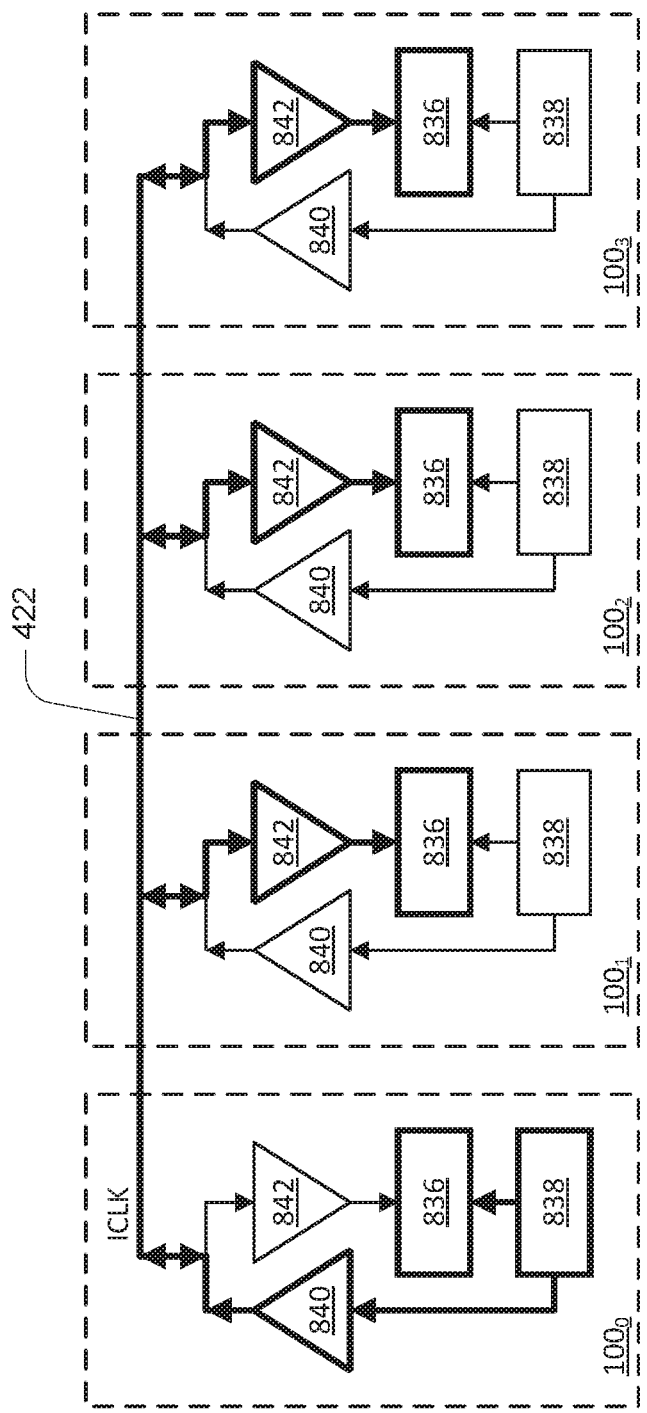
FIG. 8 is a simplified schematic of a circuit for generating an internal clock signal and a count of a wrap-around counter according to an embodiment.

FIG. 8 is a simplified schematic of a circuit for generating the internal clock signal ICLK and the count of the wrap-around counter according to an embodiment. As depicted in FIG. 8, four dies $100_0$-$100_3$ commonly share the clock signal ICLK via clock signal line 422. Each die 100 is depicted to include a clock counter (i.e., wrap-around counter) 836, a clock generator 838, an output buffer 840 and an input buffer 842. The output buffer 840 (e.g., a clock output) has its output connected to the clock signal line 422, while the input buffer 842 has its input connected to the clock signal line 422. The bolded sections denote portions of the circuits that may be active for each of the respective dies $100_0$-$100_3$ while the ready/busy control signal RB# is logic low, for some embodiments even if any of the dies $100_0$-$100_3$ is in standby mode. For the example of FIG. 8, die $100_0$ is designated for generating the clock signal ICLK, while the clock generators 838 for the remaining dies 100 are inactive.

Each of the wrap-around counters 836 is connected to receive a clock signal ICLK either directly from its corresponding clock generator 838, such as in the case of die $100_0$, or from its input buffer 842, such as in the case of dies $100_1$-$100_3$. In this manner, each of the wrap-around counters 836 may remain synched as each is operating from the same clock signal ICLK, i.e., the clock signal ICLK generated by the clock generator 838 of die $100_0$.

Figure 9:
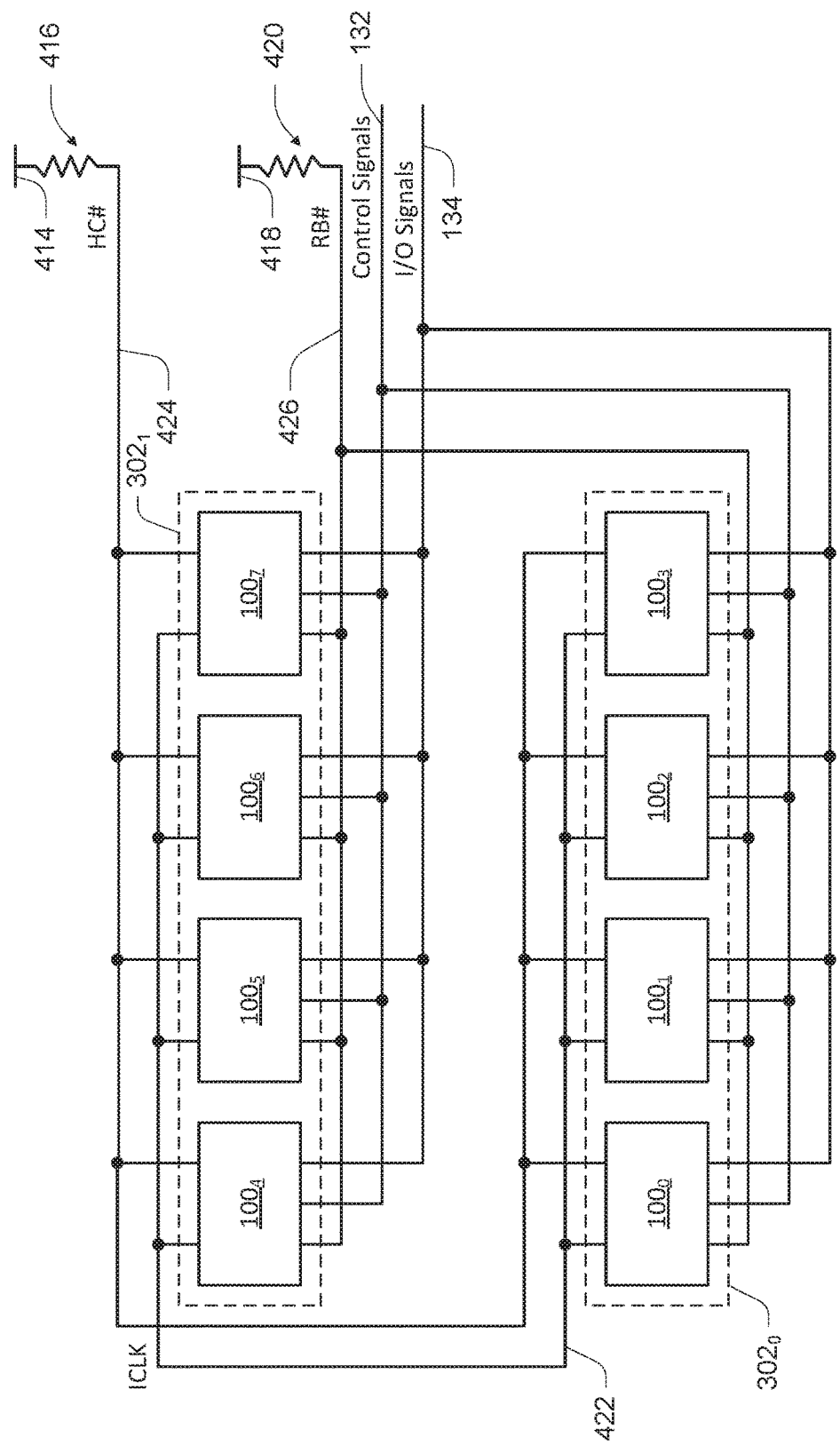
FIG. 9 is a schematic representation of a multi-die package according to an embodiment.

FIG. 9 is a schematic representation of a multi-die package including eight dies 100 (e.g., $100_0$-$100_7$) according to an embodiment. The clock signal ICLK is commonly shared between the dies 100 through a clock signal line 422. Dies $100_0$-$100_3$ might be part of a package $302_0$, such as depicted in FIG. 3, and dies $100_4$-$100_7$ might be part of another package $302_1$, where the clock signal lines 422 are commonly connected. Although depicted as two packages 302, because these packages 302 share the control link 132 and the I/O bus 134, they may be deemed a single multi-die package.

One of the dies $100_0$-$100_7$ would be designated to generate the clock signal ICLK. The clock enable signal HC# is commonly shared between the dies 100 through a clock enable signal line 424. The clock enable signal HC# may be normally pulled to a particular state (e.g., pulled high), such as by connecting the clock enable signal line 424 to a voltage supply node 414 through a resistor 416. The ready/busy control signal RB# is commonly shared between the dies 100 through a ready/busy control signal line 426. The ready/busy control signal RB# may be normally pulled to a particular state (e.g., pulled high), such as by connecting the ready/busy control signal line 426 to a voltage supply node 418 through a resistor 420. Each of the dies 100 is further commonly connected to a control link 132 and to an I/O bus 134. For such an example, wrap-around counters for each of the dies 100 might count from 0 to 7.

Figure 10:
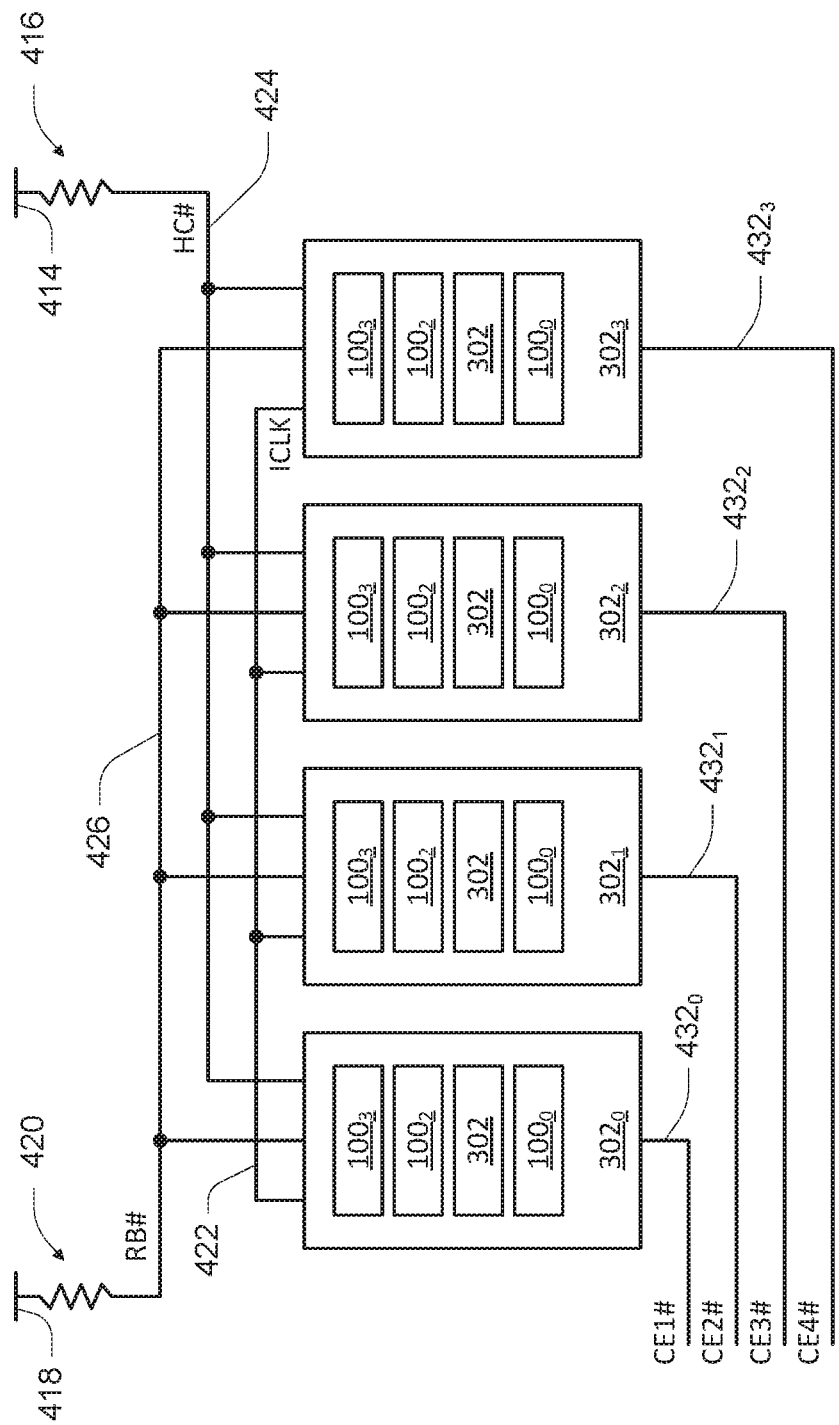
FIG. 10 is a schematic representation of a multi-die package according to an embodiment.

FIG. 10 is a schematic representation of a multi-die package including four packages 302, each including four dies 100 according to an embodiment. The clock signal ICLK is commonly shared between the dies 100 of the packages 302 through a clock signal line 422. One of the dies 100 of one of the packages 302 would be designated to generate the clock signal ICLK. For example, the die $100_0$ of package $302_0$ might be so designated. The clock enable signal HC# is commonly shared between the dies 100 through a clock enable signal line 424. The clock enable signal HC# may be normally pulled to a particular state (e.g., pulled high), such as by connecting the clock enable signal line 424 to a voltage supply node 414 through a resistor 416. The ready/busy control signal RB# is commonly shared between the dies 100 through a ready/busy control signal line 426. The ready/busy control signal RB# may be normally pulled to a particular state (e.g., pulled high), such as by connecting the ready/busy control signal line 426 to a voltage supply node 418 through a resistor 420. For such an example, wrap-around counters for each of the dies 100 might count from 0 to 15. Each of the packages $302_0$-$302_3$ might receive one of the chip enable signals CE1#-CE4# (e.g., chip enable signals $432_0$-$432_3$), respectively.

Figure 11:
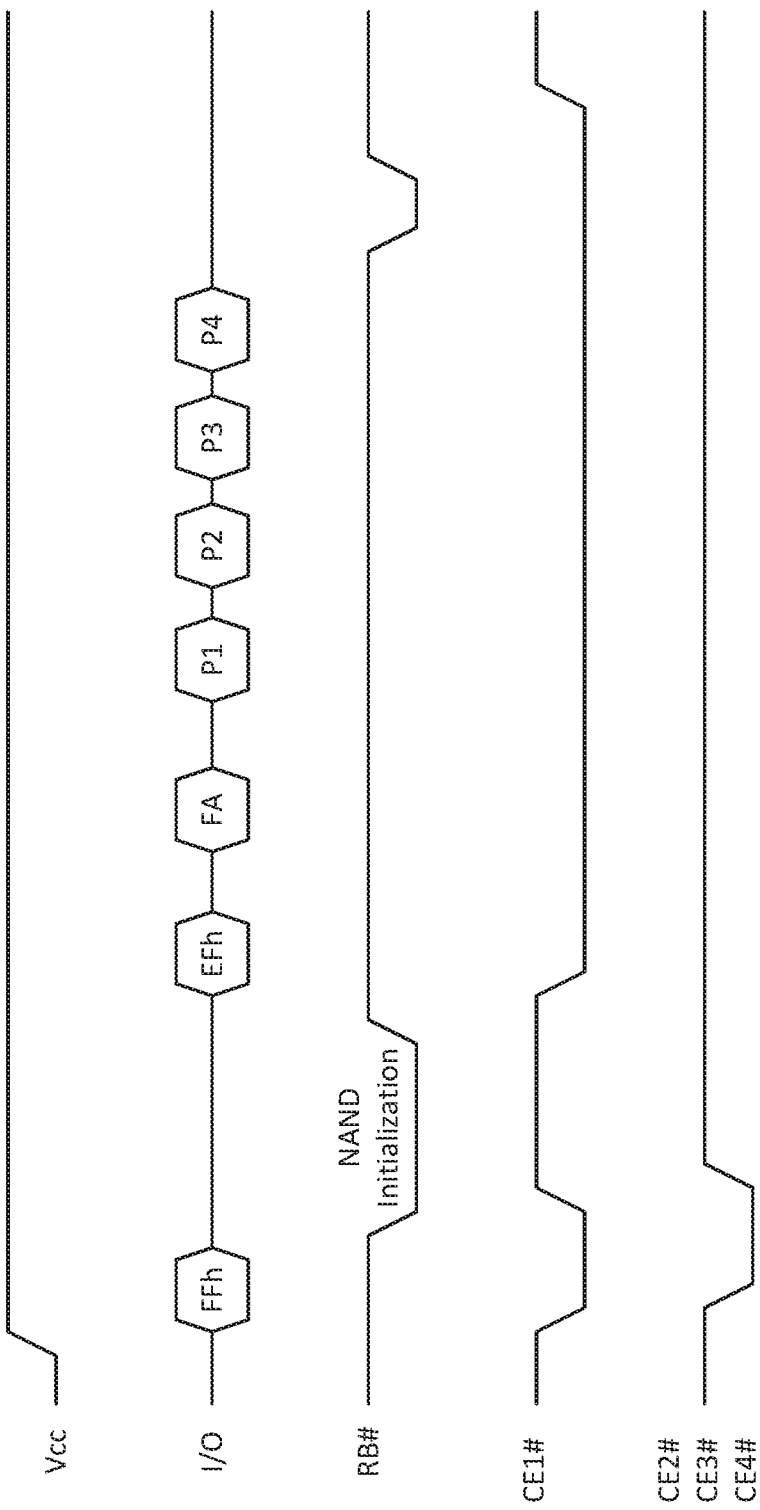
FIG. 11 is a timing diagram showing conceptually how a particular die might be designated to provide a clock signal according to an embodiment.

FIG. 11 is a timing diagram showing conceptually how a particular die 100, such as die $100_0$ of package $302_0$, might be designated to provide the clock signal ICLK according to an embodiment. For example, upon application of power (e.g., Vcc), each of the chip enable signals CE1#-CE4# might be transitioned low, to enable the dies 100 to receive commands and parameters. An initialization command (e.g., FFh) might be provided to begin an initialization routine on each of the dies 100. After the initialization routines are complete, a chip enable signal of one of the packages 302, e.g., chip enable signal CE1#, might again be transitioned low while remaining chip enable signals CE2#-CE4# remain high, thereby enabling the dies 100 of package $302_0$ to receive commands and parameters. Subsequently, a set feature command (EFh/FA) and parameters (P1-P4) might indicate to the die $100_0$ of package $302_0$ that it is to generate the clock signal ICLK, and activate the corresponding circuitry to do so (e.g., activate the bolded circuitry of die $100_0$ of FIG. 8). Remaining dies 100, e.g., dies $100_1$-$100_3$ of package $302_0$ and dies $100_0$-$100_3$ of packages $302_1$-$302_3$, might default to not generate a clock signal ICLK, but instead activate the corresponding circuitry to receive the clock signal ICLK from the clock signal line 422 (e.g., activate the bolded circuitry of dies $100_1$-$100_3$ of FIG. 8).

Figure 12:
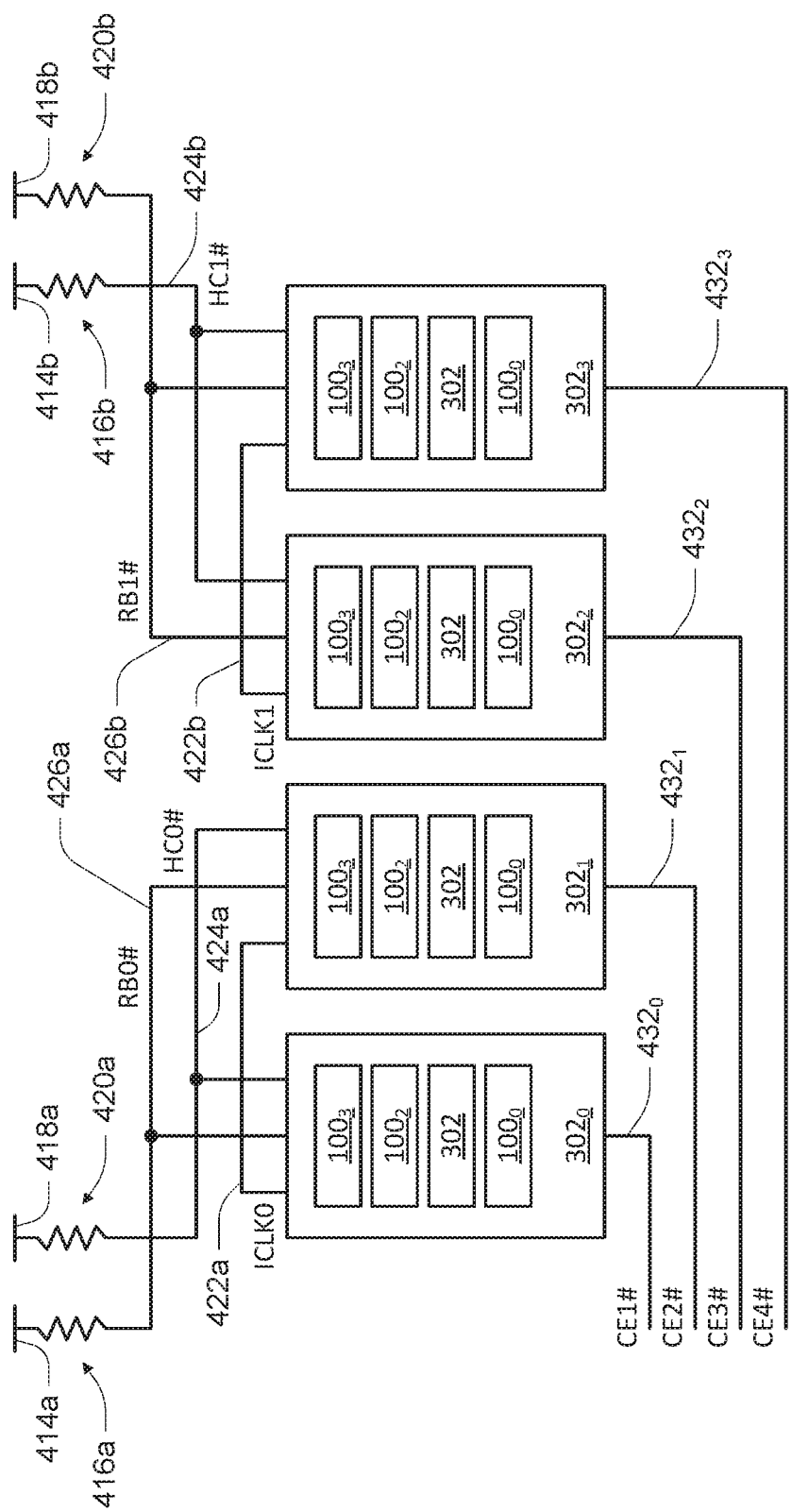
FIG. 12 is a schematic representation of two multi-die packages according to an embodiment.

FIG. 12 is a schematic representation of two multi-die packages, each including two packages 302, and each package 302 including four dies 100 according to an embodiment. The clock signal ICLK0 is commonly shared between the dies 100 of the packages $302_0$ and $302_1$ through a clock signal line 422a. One of the dies 100 of one of the packages $302_0$ and $302_1$ would be designated to generate the clock signal ICLK0. For example, the die $100_0$ of package $302_0$ might be so designated. The clock signal ICLK1 is commonly shared between the dies 100 of the packages $302_2$ and $302_3$ through a clock signal line 422b. One of the dies 100 of one of the packages $302_2$ and $302_3$ would be designated to generate the clock signal ICLK1. For example, the die $100_0$ of package $302_2$ might be so designated.

The clock enable signal HC0# is commonly shared between the dies 100 of the packages $302_0$ and $302_1$ through a clock enable signal line 424a. The clock enable signal HC0# may be normally pulled to a particular state (e.g., pulled high), such as by connecting the clock enable signal line 424a to a voltage supply node 414a through a resistor 416a. The clock enable signal HC1# is commonly shared between the dies 100 of the packages $302_2$ and $302_3$ through a clock enable signal line 424b. The clock enable signal HC1# may be normally pulled to a particular state (e.g., pulled high), such as by connecting the clock enable signal line 424b to a voltage supply node 414b through a resistor 416b.

The ready/busy control signal RB0# is commonly shared between the dies 100 of the packages $302_0$ and $302_1$ through a ready/busy control signal line 426a. The ready/busy control signal RB0# may be normally pulled to a particular state (e.g., pulled high), such as by connecting the ready/busy control signal line 426a to a voltage supply node 418a through a resistor 420a. The ready/busy control signal RB1# is commonly shared between the dies 100 of the packages $302_2$ and $302_3$ through a ready/busy control signal line 426b. The ready/busy control signal RB1# may be normally pulled to a particular state (e.g., pulled high), such as by connecting the ready/busy control signal line 426b to a voltage supply node 418b through a resistor 420b.

For the example of FIG. 12, wrap-around counters for each of the dies 100 might count from 0 to 7. Each of the packages $302_0$-$302_3$ might receive one of the chip enable signals CE1#-CE4# (e.g., chip enable signals $432_0$-$432_3$), respectively.

Figure 13:
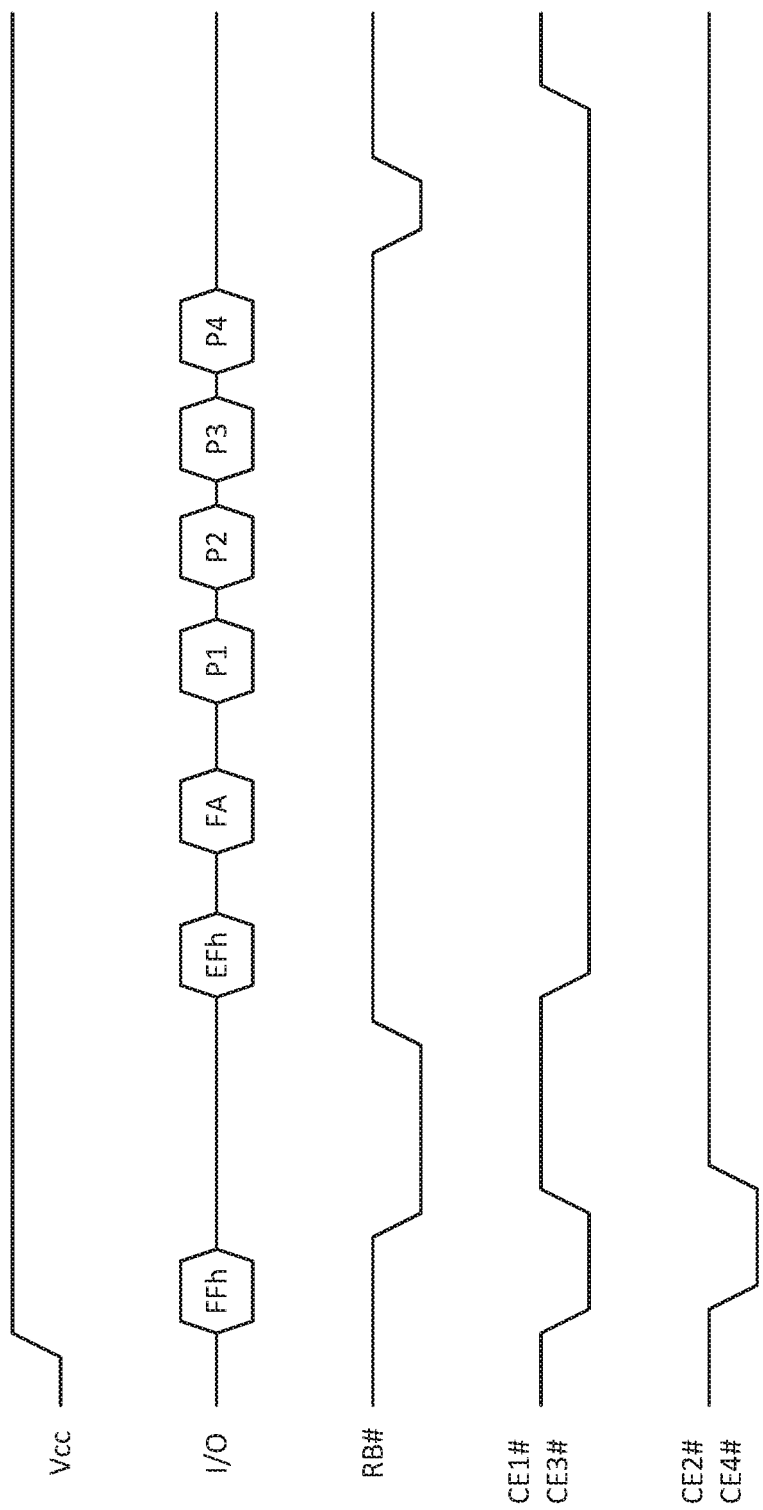
FIG. 13 is a timing diagram showing conceptually how particular dies might be designated to provide their respective clock signals according to an embodiment.

FIG. 13 is a timing diagram showing conceptually how particular dies 100, such as dies $100_0$ of packages $302_0$ and $302_2$, might be designated to provide their respective clock signals ICLK0 and ICLK1 according to an embodiment. For example, upon application of power (e.g., Vcc), each of the chip enable signals CE1#-CE4# might be transitioned low, to enable the dies 100 to receive commands and parameters. An initialization command (e.g., FFh) might be provided to begin an initialization routine on each of the dies 100. After the initialization routines are complete, a chip enable signal of two of the packages 302, e.g., chip enable signals CE1# and CE3#, might again be transitioned low while remaining chip enable signals CE2# and CE4# remain high, thereby enabling the dies 100 of packages $302_0$ and $302_2$ to receive commands and parameters. Subsequently, a set feature command (EFh/FA) and parameters (P1-P4) might indicate to the dies $100_0$ of packages $302_0$ and $302_2$ that they are to generate their respective clock signals ICLK0 and ICLK1, and activate the corresponding circuitry to do so (e.g., activate the bolded circuitry of die $100_0$ of FIG. 8). Remaining dies 100, e.g., dies $100_1$-$100_3$ of packages $302_0$ and $302_2$ and dies $100_0$-$100_3$ of packages $302_1$ and $302_3$, might default to not generate a clock signal but instead activate the corresponding circuitry to receive their respective clock signal ICLK0 or ICLK1 from their respective clock signal line 422a or 422b (e.g., activate the bolded circuitry of dies $100_1$-$100_3$ of FIG. 8).

Figure 14:
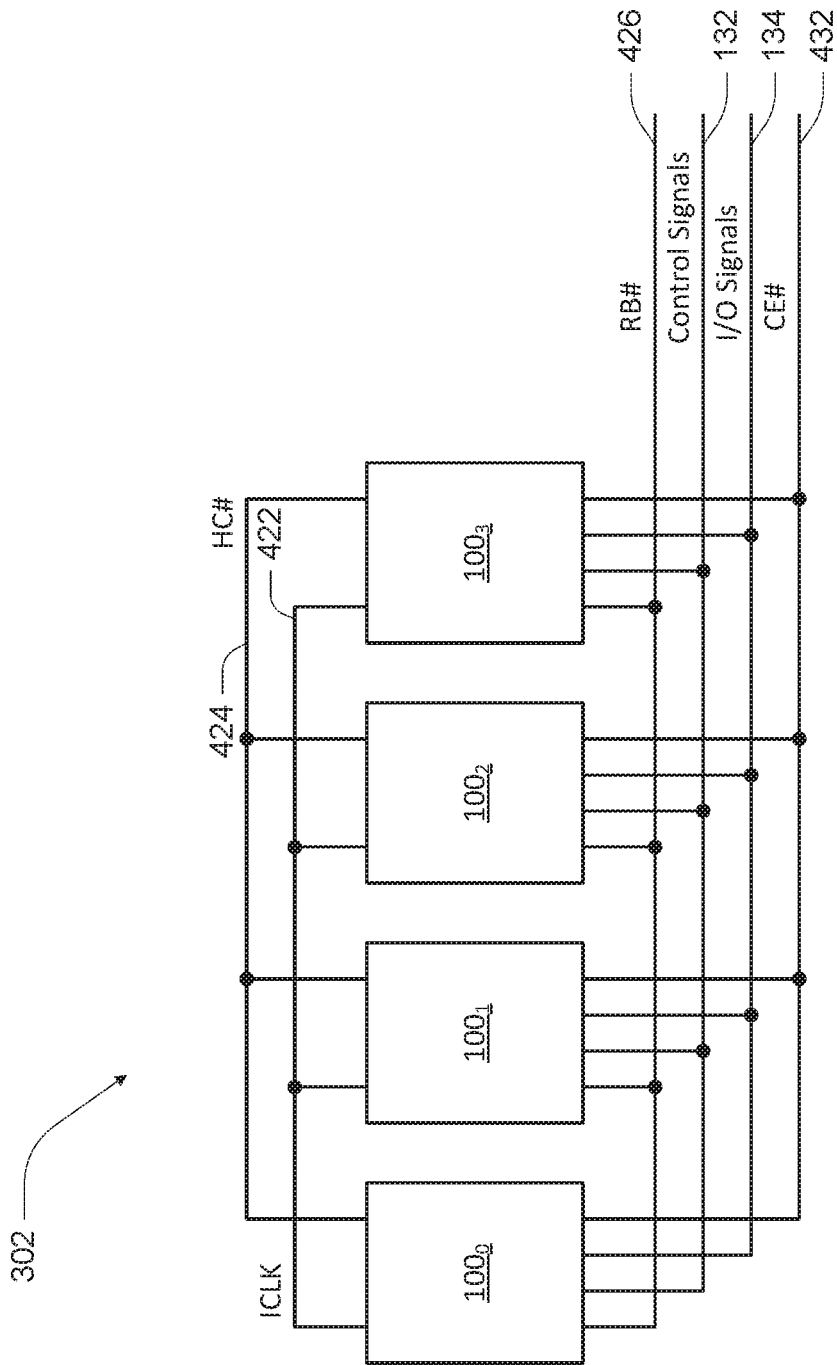
FIG. 14 is a schematic representation of a multi-die package according to an embodiment.

FIG. 14 is a schematic representation of the multi-die package 302 including four dies 100 (e.g., $100_0$-$100_3$) according to an embodiment. The multi-die package 302 of FIG. 14 differs from the multi-die package of FIG. 4 in that neither the clock enable signal line 424 nor the ready/busy control signal line 426 are depicted to be connected to a pull-up resistor. Such a configuration might be used where it is desired to not rely on an external pull-up resistor for the clock enable signal line 424. For example, this might be advantageous for backward compatibility in a system where an external pull-up resistor is not available to the ready/busy control signal line 426.

Figure 15:
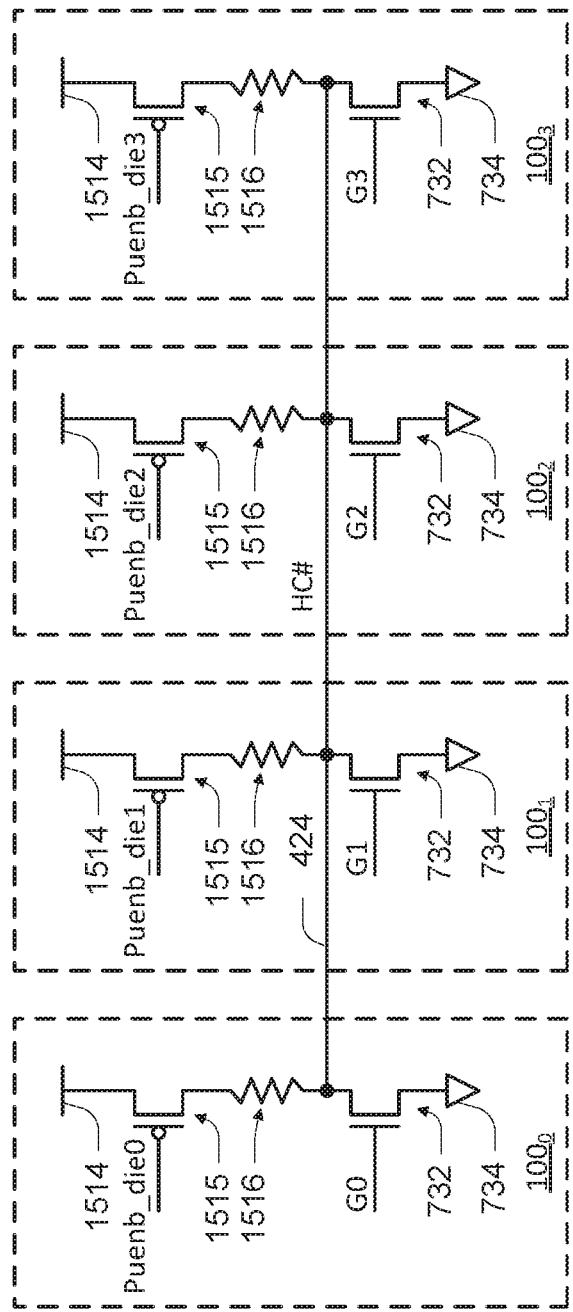
FIG. 15 is a simplified schematic of a circuit for generating a clock enable signal for the type of multi-die package depicted in FIG. 14 according to an embodiment.

FIG. 15 is a simplified schematic of a circuit for generating the clock enable signal HC# for the type of multi-die package depicted in FIG. 14 according to an embodiment. As depicted in FIG. 15, four dies $100_0$-$100_3$ commonly share the clock enable signal HC# via clock enable signal line 424. The clock enable signal line 424 is selectively connected to a voltage supply node 1514, coupled to receive a supply voltage such as Vcc, through a resistor 1516 and a switch, e.g., transistor 1515, each transistor 1515 having a control gate coupled to receive a control signal. The resistor 1516, transistor 1515 and voltage supply node 1514 may be collectively referred to as a weak pull-up driver, or simply pull-up driver. Die $100_0$ may have the control gate of its transistor 1515 coupled to receive the control signal Puenb_die0, die $100_1$ may have the control gate of its transistor 1515 coupled to receive the control signal Puenb_die1, die $100_2$ may have the control gate of its transistor 1515 coupled to receive the control signal Puenb_die2, and die $100_3$ may have the control gate of its transistor 1515 coupled to receive the control signal Puenb_die3. These control signals are generated to deactivate their respective transistor 1515 unless they are designated to pull up the clock enable signal HC#. For example, where die $100_0$ is designated to normally pull the clock enable signal HC# high, its control signal Puenb_die0 might be normally low to activate its respective p-type field-effect transistor (p-FET) 1515, while the control signals Puenb_die1, Puenb_die2 and Puenb_die3 might be normally high to deactivate their respective transistors 1515.

For each of the dies $100_0$-$100_3$, another voltage supply node, such as reference potential node 734, coupled to receive a reference potential such as a ground or Vss, may be selectively connected to the clock enable signal line 424 through a switch, e.g., a transistor 732, each having a control gate coupled to receive a control signal. For example, die $100_0$ may have the control gate of its transistor 732 coupled to receive the control signal G0, die $100_1$ may have the control gate of its transistor 732 coupled to receive the control signal G1, die $100_2$ may have the control gate of its transistor 732 coupled to receive the control signal G2, and die $100_3$ may have the control gate of its transistor 732 coupled to receive the control signal G3. These control signals are generated (e.g., by the controllers of the dies) to activate their respective transistor 732 when their respective die 100 has entered a high-current demand portion of an access operation, e.g., in response to a counter value of a wrap-around counter matching an assigned counter value for that die 100 while the access operation of that die 100 is paused at one of the designated points. As an example, the control signals for the gates of transistors 732 may be normally logic low to deactivate the depicted n-FET, and may transition to a logic high during periods of high current demand for their respective die 100. As such, when a transistor 732 is activated, the voltage level of the clock enable signal line 424 will be pulled to a logic low, and the voltage level of the clock enable signal line 424 will be pulled back to a logic high when none of the transistors 732 are activated. For some embodiments, the die 100 designated to normally pull the clock enable signal HC# high may disable its pull-up driver when any of the dies 100 sharing the clock enable signal HC# is in a period of high current demand, e.g., when any of the control signals G0-G3 of FIG. 15 have a logic level to activate their respective transistors 732. To avoid the clock enable signal HC# floating before one of the transistors 1515 is activated, each transistor 1515 of a die 100 sharing the clock enable signal HC# may be activated during power-up of the dies 100, then deactivated after completion of the power-up routine. During this period, the transistors 732 of these dies 100 remain deactivated.

Figure 16:
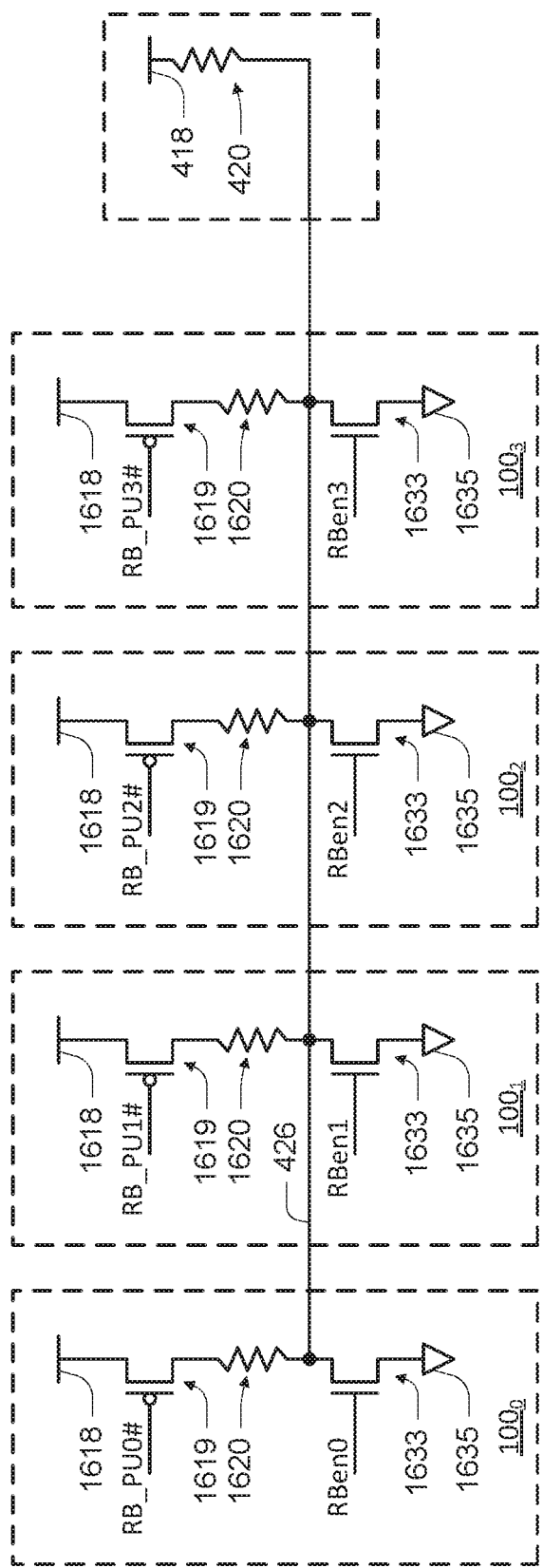
FIG. 16 is a simplified schematic of a circuit for generating a ready/busy control signal for the type of multi-die packages depicted in FIGS. 4 and 14 according to an embodiment.

FIG. 16 is a simplified schematic of a circuit for generating the ready/busy control signal RB# for the type of multi-die packages depicted in FIGS. 4 and 14, e.g., whether or not the ready/busy control signal line can be connected to an available pull-up resistor, according to an embodiment. As depicted in FIG. 16, four dies $100_0$-$100_3$ commonly share the ready/busy control signal RB# via ready/busy control signal line 426. The ready/busy control signal line 426 can be connected to an external pull-up resistor, i.e., voltage supply node 418 coupled to receive a supply voltage such as Vcc, and resistor 420. In addition or in the alternative, for each die 100 sharing the ready/busy control signal line 426, the ready/busy control signal line 426 is selectively connected to a voltage supply node 1618, coupled to receive a supply voltage such as Vcc, through a resistor 1620 and a switch, e.g., transistor 1619. The resistor 1620, transistor 1619 and voltage supply node 1618 may be collectively referred to as a weak pull-up driver, or simply pull-up driver. Each transistor 1619 may have its control gate coupled to receive a control signal. Die $100_0$ may have the control gate of its transistor 1619 coupled to receive the control signal RB_PU0#, die $100_1$ may have the control gate of its transistor 1619 coupled to receive the control signal RB_PU1#, die $100_2$ may have the control gate of its transistor 1619 coupled to receive the control signal RB_PU2#, and die $100_3$ may have the control gate of its transistor 1619 coupled to receive the control signal RB_PU3#. These control signals are generated to deactivate their respective transistor 1619 unless they are designated to pull up the ready/busy control signal RB#, such as in the case where no pull-up transistor (e.g., voltage supply node 418 and resistor 420) is available external to the dies 100. For example, where die $100_0$ is designated to normally pull the ready/busy control signal RB# high, its control signal RB_PU0# might be normally low to activate its respective p-type field-effect transistor (p-FET) 1619, while the control signals RB_PU1#, RB_PU2# and RB_PU3# might be normally high to deactivate their respective transistors 1619. In cases where a pull-up transistor is available to the ready/busy control signal line 426 external to the dies 100, each of the transistors 1619 might be deactivated.

For each of the dies $100_0$-$100_3$, another voltage supply node, such as reference potential node 1635, coupled to receive a reference potential such as a ground or Vss, may be selectively connected to the ready/busy control signal line 426 through a switch, e.g., a transistor 1633, each having a control gate coupled to receive a control signal. For example, die $100_0$ may have the control gate of its transistor 1633 coupled to receive the control signal RBen0, die $100_1$ may have the control gate of its transistor 1633 coupled to receive the control signal RBen1, die 100₂ may have the control gate of its transistor 1633 coupled to receive the control signal RBen2, and die 100₃ may have the control gate of its transistor 1633 coupled to receive the control signal RBen3. These control signals are generated to activate their respective transistor 1633 when their respective die 100 is busy, e.g., during periods of an access operation. As an example, the control signals for the gates of transistors 1633 may be normally logic low to deactivate the depicted n-FET, and may transition to a logic high when an access operation is initiated, and may return to a logic low when the access operation is completed. As such, when a transistor 1633 is activated, the voltage level of the ready/busy control signal line 426 will be pulled to a logic low, and the voltage level of the ready/busy control signal line 426 will be pulled back to a logic high when none of the transistors 1633 are activated. For some embodiments, the die 100 designated to normally pull the ready/busy control signal RB# high may disable its pull-up driver when any of the dies 100 sharing the ready/busy control signal RB# is in a period of high current demand, e.g., when any of the control signals RBen0-RBen3 of FIG. 16 have a logic level to activate their respective transistors 1633. To avoid the ready/busy control signal RB# floating before one of the transistors 1619 is activated, each transistor 1619 of a die 100 sharing the ready/busy control signal RB# may be activated during power-up of the dies 100, then deactivated after completion of the power-up routine. During this period, the transistors 1633 of these dies 100 remain deactivated.

Figure 17:
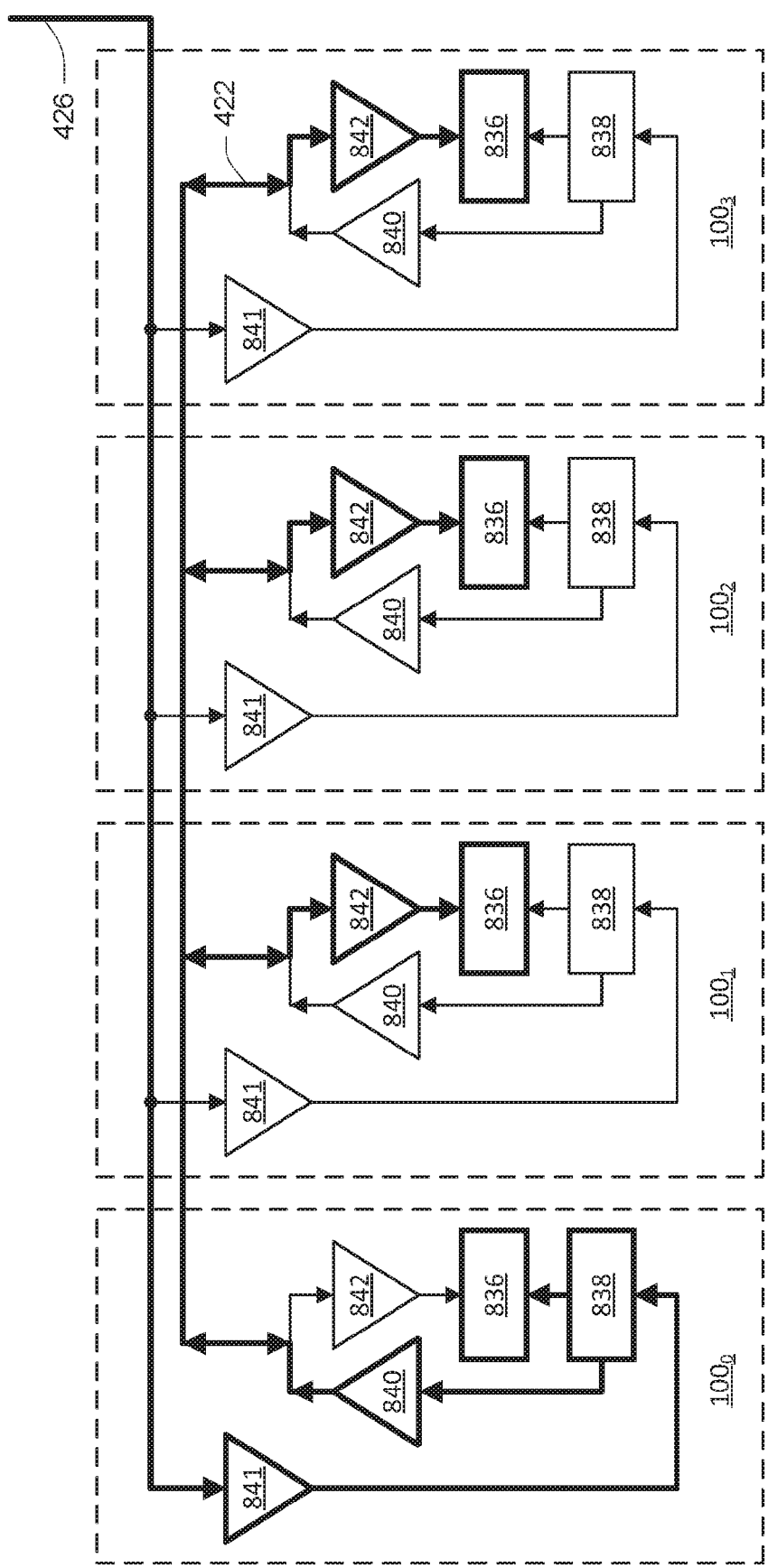
FIG. 17 is a simplified schematic of a circuit for generating a clock signal and a count of a wrap-around counter according to an embodiment.

FIG. 17 is a simplified schematic of a circuit for generating the internal clock signal ICLK and the count of the wrap-around counter showing an example of using the ready/busy control signal RB# to enable the clock generator according to an embodiment. As depicted in FIG. 17, four dies 100₀-100₃ commonly share the clock signal ICLK via clock signal line 422. Each die 100 is depicted to include a clock counter (i.e., wrap-around counter) 836, a clock generator 838, an output buffer 840 and an input buffer 842. The output buffer 840 has its output connected to the clock signal line 422, while the input buffer 842 has its input connected to the clock signal line 422. Each die 100 is further depicted to include an input buffer 841 having its input connected to the ready/busy control signal line 426 and its output connected to the clock generator 838. The clock generator 838 may utilize the output of the buffer 841 as an enable signal, i.e., generating the clock signal ICLK if the output of the buffer 841 has a first logic level, such as logic low, and stopping generation of the clock signal ICLK if the output of the buffer 841 has a second logic level, such as logic high. Although not shown in FIG. 17, the output of the buffer 841 might be connected to the wrap-around counter 836 to reset the value of the wrap-around counter 836 (e.g., reset to zero), when the output of the buffer 841, and thus the ready/busy control signal RB#, is a logic high.

The bolded sections of FIG. 17 denote portions of the circuits that may be active for each of the respective dies 100₀-100₃ while the ready/busy control signal RB# is logic low, for some embodiments even if any of the dies 100₀-100₃ is in standby mode. For the example of FIG. 17, die 100₀ is designated for generating the clock signal ICLK, while the clock generators 838 for the remaining dies 100 are inactive. Each of the wrap-around counters 836 is connected to receive a clock signal ICLK either directly from its corresponding clock generator 838, such as in the case of die 100₀, or from its input buffer 842, such as in the case of dies 100₁-100₃. In this manner, each of the wrap-around counters 836 may remain synched as each is operating from the same clock signal ICLK, i.e., the clock signal ICLK generated by the clock generator 838 of die 100₀.

Figure 17A:
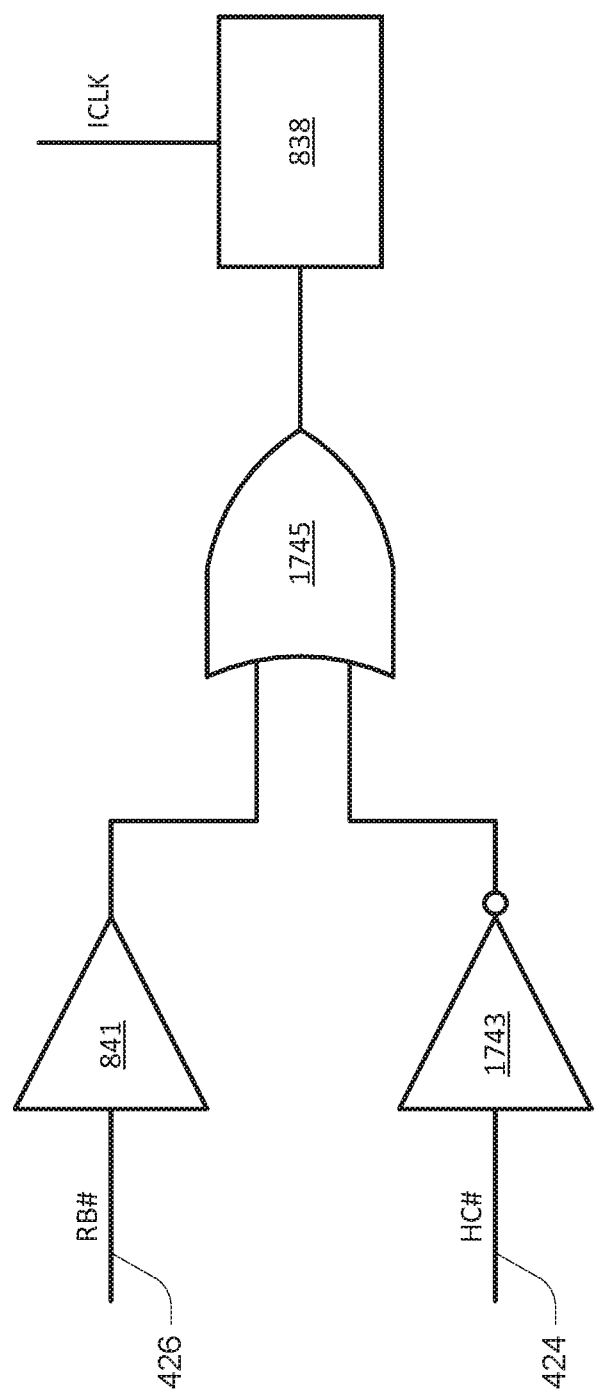
FIG. 17a is a simplified schematic of combinatorial logic that might be used to selectively enable a clock generator in response to both a ready/busy control signal and a clock enable signal according to an embodiment.

FIG. 17a is a simplified schematic of combinatorial logic that might be used to selectively enable a clock generator in response to both the ready/busy control signal RB# and the clock enable signal HC# according to an embodiment. Between the buffer 841 and the clock generator 838, an OR-gate 1745 might be inserted. For example, instead of connecting the output of the buffer 841 to the clock generator 838, such as depicted in FIG. 17, the output of the buffer 841 can be connected to one input of the OR-gate 1745, while the output of the OR-gate 1745 is connected to the clock generator 838. In addition, another input of the OR-gate 1745 may be connected to the output of an inverting buffer 1743, which has its input connected to the clock enable signal line 424. In this manner, the clock generator 838 might be enabled to generate the clock signal ICLK only when the ready/busy control signal RB# is logic low and the clock enable signal HC# is logic high, such as shown and described with reference to FIGS. 5 and 6.

Figure 18:
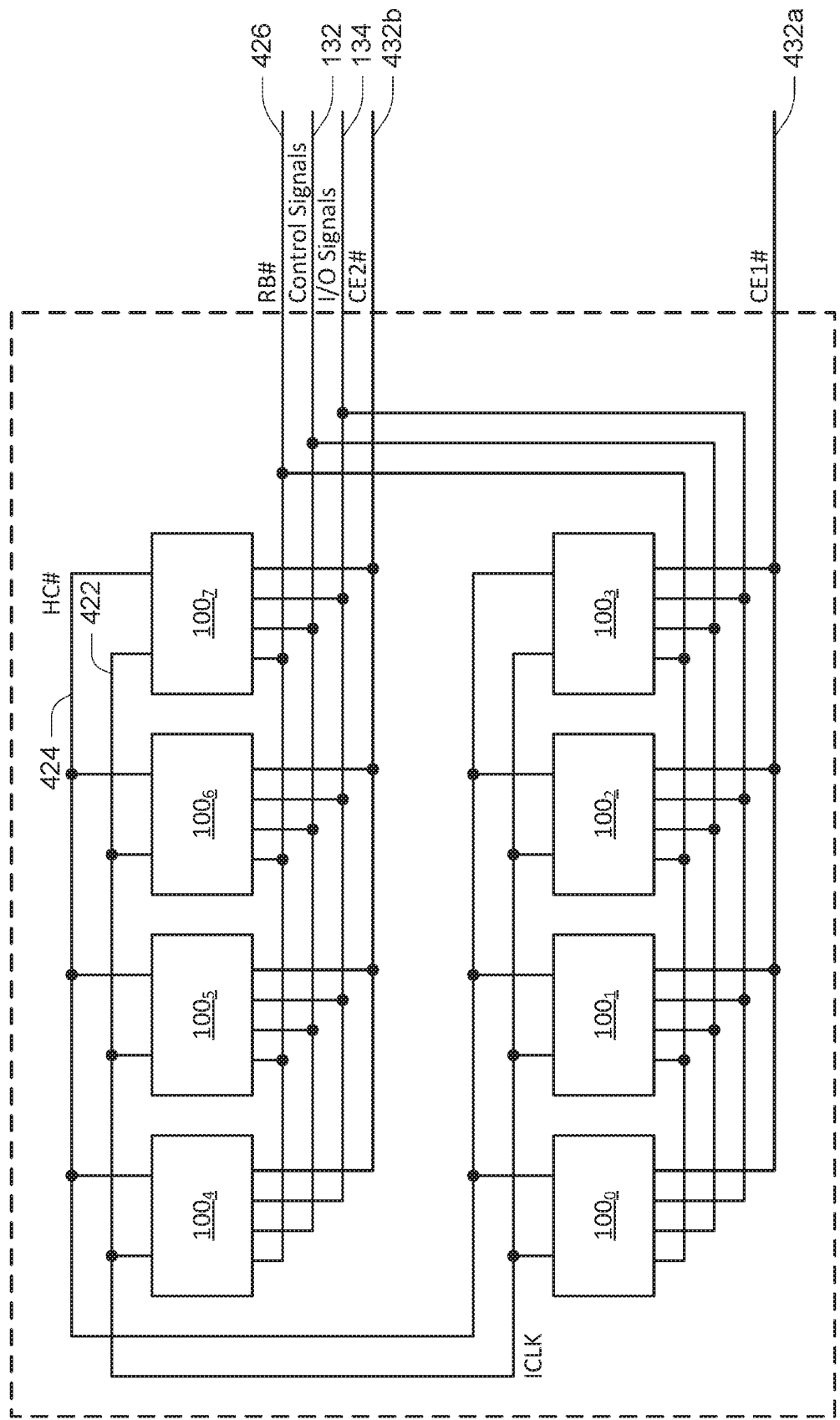
FIG. 18 is a schematic representation of a multi-die package according to an embodiment.

FIG. 18 is a schematic representation of a multi-die package including eight dies 100 (e.g., 100₀-100₇) according to an embodiment. The clock signal ICLK is commonly shared between the dies 100 through a clock signal line 422. Dies 100₀-100₇ might be part of a package 302. Dies 100₀-100₃ might be selectively enabled in response to a chip enable signal CE1# through chip-enable signal line 432a. Dies 100₄-100₇ might be selectively enabled in response to a chip enable signal CE2# through chip-enable signal line 432b.

One of the dies 100₀-100₃ might be designated to generate the clock signal ICLK when it is enabled in response to chip enable signal CE1#, and one of the dies 100₄-100₇ might be designated to generate the clock signal ICLK when it is enabled in response to chip enable signal CE2#. The clock enable signal HC# is commonly shared between the dies 100 through a clock enable signal line 424. The clock enable signal HC# may be normally pulled to a particular state (e.g., pulled high). The ready/busy control signal RB# is commonly shared between the dies 100 through a ready/busy control signal line 426. The ready/busy control signal RB# may be normally pulled to a particular state (e.g., pulled high). Each of the dies 100 is further commonly connected to a control link 132 and to an I/O bus 134. For such an example, wrap-around counters for each of the dies 100 might count from 0 to 7, even though some of the dies 100 might be disabled in response to their respective chip enable signal.

Figure 19:
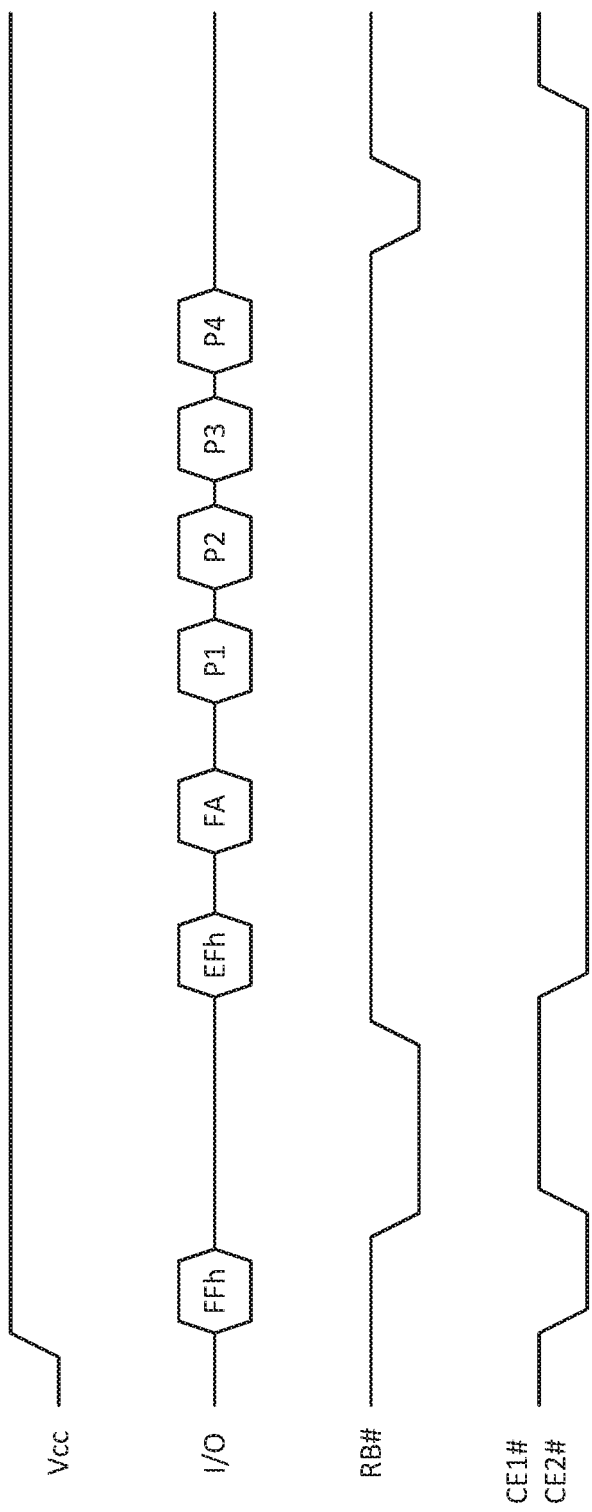
FIG. 19 is a timing diagram showing conceptually how particular dies might be designated to provide a clock signal according to an embodiment

FIG. 19 is a timing diagram showing conceptually how particular dies 100, such as dies 100₀ and 100₄ for example, might be designated to provide the clock signal ICLK when enabled in response to their respective chip enable signals CE1# and CE2# according to an embodiment. For example, upon application of power (e.g., Vcc), each of the chip enable signals CE1# and CE2# might be transitioned low, to enable the dies 100₀-100₇ to receive commands and parameters. An initialization command (e.g., FFh) might be provided to begin an initialization routine on each of the dies 100. After the initialization routines are complete, chip enable signals CE1# and CE2# might again be transitioned low. Subsequently, a set feature command (EFh/FA) and parameters (P1-P4) might indicate to the dies 100₀ and 100₄ that they are to generate the clock signal ICLK, and activate the corresponding circuitry to do so (e.g., activate the bolded circuitry of die 100₀ of FIG. 8 or 17). Remaining dies 100, e.g., dies 100₁-100₃ and dies 100₅-100₇ in this example, might default to not generate a clock signal but instead activate the corresponding circuitry to receive the clock signal ICLK from the clock signal line 422 (e.g., activate the bolded circuitry of dies 100$_1$-100$_3$ of FIG. 8 or 17).

Figure 20:
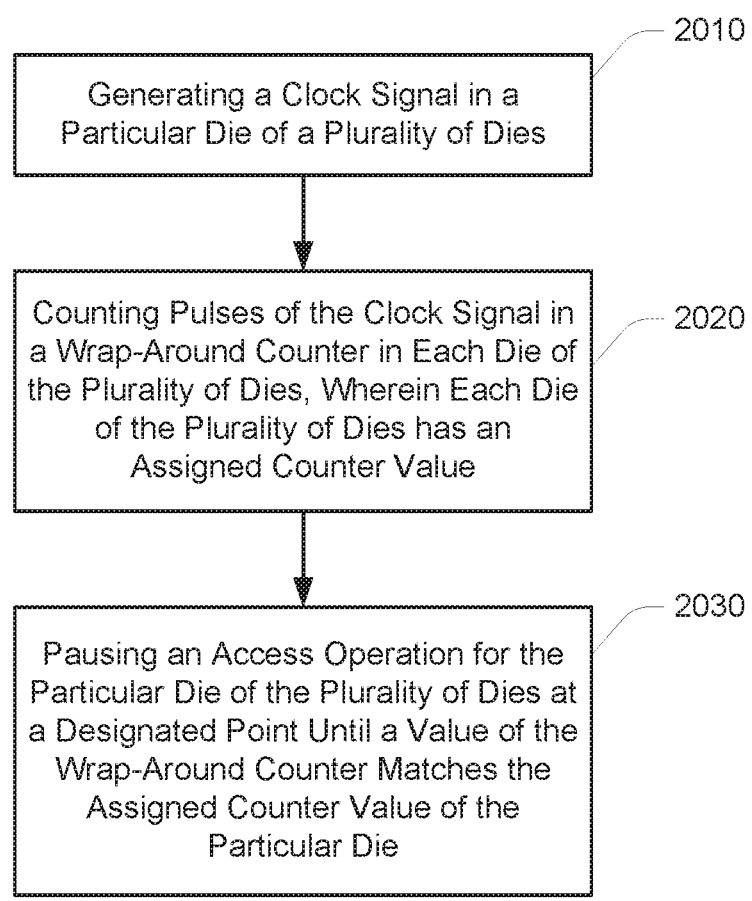
FIG. 20 is a flowchart of a method of operating a plurality of dies according to an embodiment.

FIG. 20 is a flowchart of a method of operating a plurality of dies according to an embodiment. At 2010, a clock signal is generated in a particular die of the plurality of dies. The plurality of dies commonly share the clock signal. At 2020, pulses of the clock signal are counted in a wrap-around counter in each die of the plurality of dies. Each die of the plurality of dies has an assigned counter value. For example, in a multi-die package containing N dies, counter values of 0 through N−1 might be assigned, one value to each die without repetition. As such, the wrap-around counter counts from a first value, e.g., 0, to a last value, e.g., N−1, and then returns to the first value on the next clock signal. At 2030, an access operation for the particular die of the plurality of dies is paused at a designated point until a value of the wrap-around counter matches the assigned counter value of the particular die.

Figure 21:
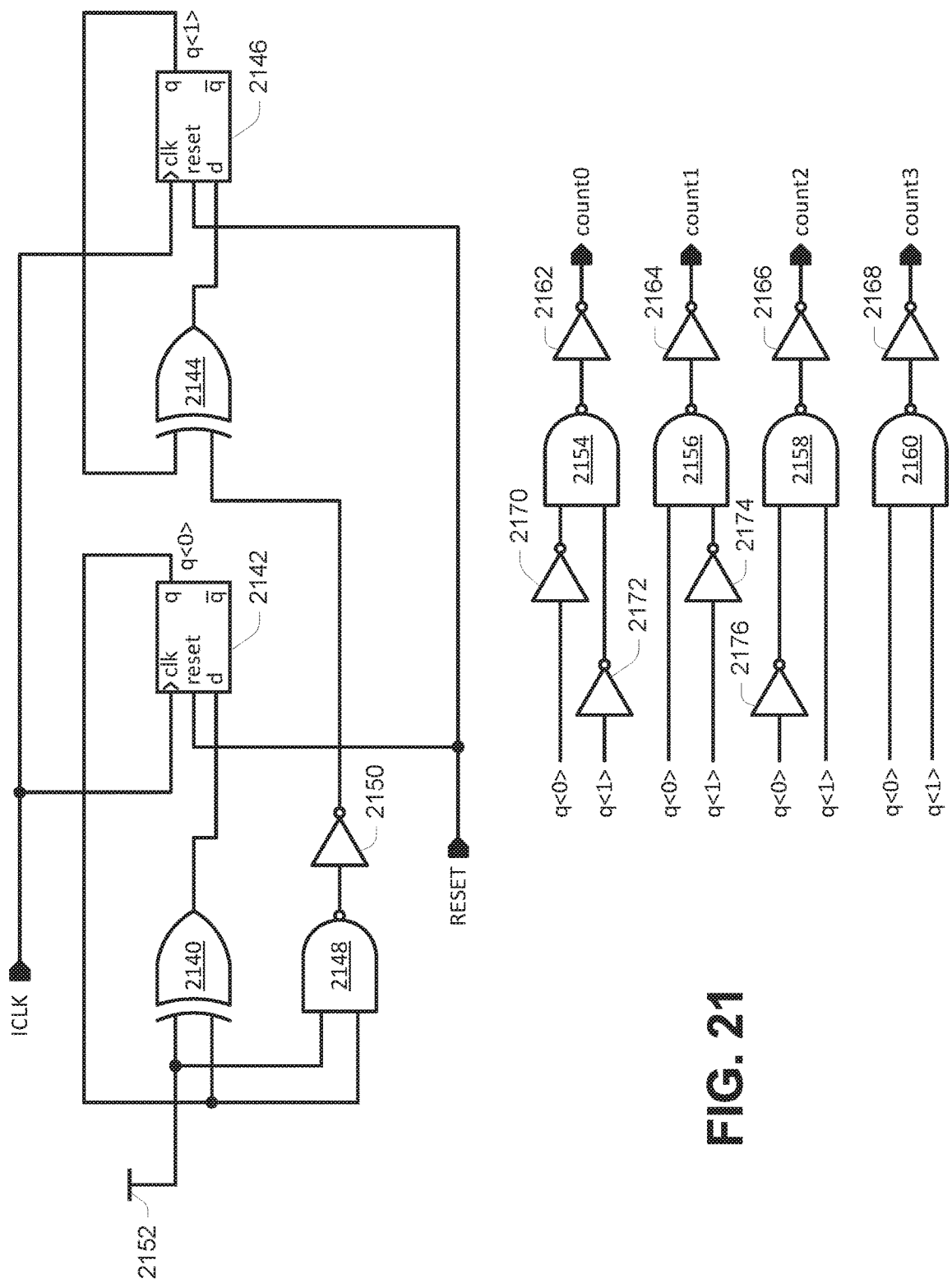
FIG. 21 is a schematic of a wrap-around counter according to an embodiment.

FIG. 21 is a schematic of a wrap-around counter according to an embodiment. The wrap-around counter includes an XOR gate 2140 having its output coupled to the control input (e.g., d input) of a D flip-flop 2142, a first input coupled to a supply node 2152 to receive a supply voltage, e.g., Vcc, and a second input coupled to the output (e.g., a normal output or q output) of the D flip-flop 2142. The D flip-flop 2142 might be a rising edge triggered D flip-flop, for example. The inverted output or q-bar output of the D flip-flop 2142 may be unused. The D flip-flop 2142 has its clock input coupled to receive the internal clock signal ICLK, and is further coupled to receive a RESET signal. The RESET signal may represent the ready/busy control signal RB#. The wrap-around counter further includes a NAND gate 2148 having a first input coupled to the first input of the XOR gate 2140, a second input coupled to the second input of the XOR gate 2140, and an output coupled to the input of an inverter 2150. The wrap-around counter further includes an XOR gate 2144 having its output coupled to the control input (e.g., d input) of a D flip-flop 2146, a first input coupled to the output (e.g., normal output or q output) of the D flip-flop 2146, and a second input coupled to the output of the inverter 2150. The D flip-flop 2146 might be a rising edge triggered D flip-flop, for example. The inverted output or q-bar output of the D flip-flop 2142 may be unused. The D flip-flop 2146 has its clock input coupled to receive the internal clock signal ICLK, and is further coupled to receive the RESET signal. The output of the D flip-flop 2142 represents the signal q<0> while the output of the D flip-flop 2146 represents the signal q<1>.

The wrap-around counter of FIG. 21 represents a 2-bit wrap-around counter, providing values of 0 to 3, for example. The signals q<0> and q<1> of the wrap-around counter may be combined to generate signals representative of the value of the wrap-around counter. For example, the wrap-around counter may further include an inverter 2162 providing a count0 signal at its output, and having its input coupled to the output of a NAND gate 2154. The NAND gate 2154 has a first input coupled to the output of an inverter 2170, and a second input coupled to the output of an inverter 2172. The inverter 2170 has its input coupled to receive the q<0> signal, while the inverter 2172 has its input coupled to receive the q<1> signal. The count0 signal may represent a counter value of 0 when it has a particular logic level, e.g., a logic high. The wrap-around counter may further include an inverter 2164 providing a count1 signal at its output, and having its input coupled to the output of a NAND gate 2156. The NAND gate 2156 has a first input coupled to receive the q<0> signal, and a second input coupled to the output of an inverter 2174. The inverter 2174 has its input coupled to receive the q<1> signal. The count1 signal may represent a counter value of 1 when it has a particular logic level, e.g., a logic high. The wrap-around counter may further include an inverter 2166 providing a count2 signal at its output, and having its input coupled to the output of a NAND gate 2158. The NAND gate 2158 has a first input coupled to the output of an inverter 2176, and a second input coupled to receive the q<1> signal. The inverter 2176 has its input coupled to receive the q<0> signal. The count2 signal may represent a counter value of 2 when it has a particular logic level, e.g., a logic high. The wrap-around counter may further include an inverter 2168 providing a count3 signal at its output, and having its input coupled to the output of a NAND gate 2160. The NAND gate 2160 has a first input coupled to receive the q<0> signal, and a second input coupled to receive the q<1> signal. The count3 signal may represent a counter value of 3 when it has a particular logic level, e.g., a logic high.

Figure 22:
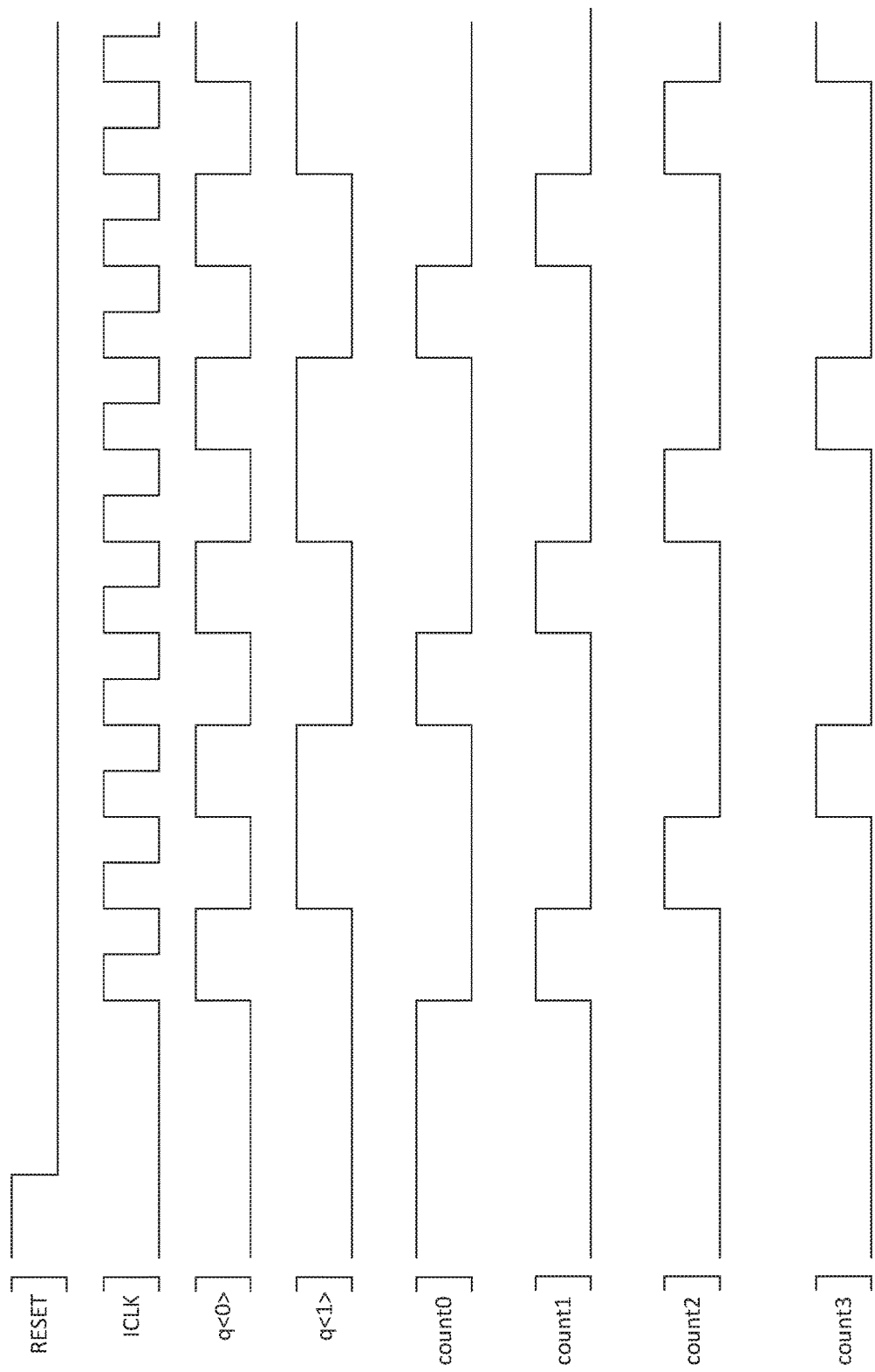
FIG. 22 depicts waveforms for the wrap-around counter of FIG. 21.

FIG. 22 depicts waveforms for the wrap-around counter of FIG. 21. For the example wrap-around counter of FIG. 21, the signals q<0> and q<1> are held to logic low if the RESET signal is asserted, e.g., has a logic high level. In addition, the signals q<0> and q<1> will not transition until the internal clock signal ICLK is enabled while the RESET signal is deasserted, e.g., has a logic low level. As can be seen in FIG. 22, the signals count0, count1, count2 and count3 are successively transitioned to logic high for one period of the internal clock signal ICLK. When the last count signal, e.g., signal count3 is transitioned logic low, the wrap-around counter returns to transition the signal count0 to logic high to repeat the cycle while the internal clock signal ICLK is enabled. Thus, for an embodiment using four dies, each die could look to a respective count signal of the wrap-around counter of FIG. 21 to determine when the wrap-around counter value matches a counter number assigned to that die. For example, a die assigned a counter number of 0 could deem the counter value to be 0 when the signal count0 has a logic high level, a die assigned a counter number of 1 could deem the counter value to be 1 when the signal count1 has a logic high level, a die assigned a counter number of 2 could deem the counter value to be 2 when the signal count2 has a logic high level, and a die assigned a counter number of 3 could deem the counter value to be 3 when the signal count3 has a logic high level.

While the wrap-around counter of FIG. 21 depicted an example for generating counter values of 0 to 3 (e.g., a 2-bit counter), wrap-around counters having different counter values may be designed by those of ordinary skill in the art. For example, a wrap-around counter for generating counter values of 0 to 1 (e.g., a 1-bit counter) might be obtained using a single D flip-flop, where a counter value of 0 might correspond to a normal output having a logic high level, and a counter value of 1 might correspond to an inverted output having a logic high level. In addition, a wrap-around counter for generating counter values of 0 to 7 (e.g., a 3-bit counter) might be obtained by repeating the circuitry for generating signals q<0> and q<1>, but providing signal q<0> to the clock inputs of the two D flip-flops to generate signals q<2> and q<3> (not shown) at the outputs of the two additional D flip-flops. The resulting signals q<0>, q<1>, q<2> and q<3> could then be logically combined to generate eight count signals, each successively transitioning to a logic high level for one period of the internal clock signal ICLK. Similarly, logic levels representative of particular states or counter values can be altered as desired using appropriate combinatorial logic.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. For example, while operation might have been described as being enabled or activated in response to a first logic level, and disabled or deactivated in response to a second logic level, it would be a straightforward task to alter the logic to enable/activate in response to the second logic level, and disable/deactivate in response to the first logic level. Similarly, while the discussion referred to voltage supply nodes and reference potential nodes as corresponding to high and low voltages, respectively, these conventions could also be reversed. Accordingly, this application is intended to cover any adaptations or variations of the embodiments.

What is claimed is:

1. An apparatus, comprising:
   an array of memory cells;
   a controller for performing an access operation on the array of memory cells;
   an input buffer having an input connected to a clock signal line and having an output;
   a clock generator for selectively generating an internal clock signal;
   an output buffer having an input connected to receive the internal clock signal and having an output connected to the clock signal line; and
   a counter for counting pulses of a particular clock signal selected from a group consisting of the internal clock signal from the clock generator and an external clock signal from the output of the input buffer, and for providing a value of the counter to the controller.

2. The apparatus of claim 1, wherein the input buffer is a first input buffer, the apparatus further comprising:
   a second input buffer having an input connected to a ready/busy control signal line and having an output connected to the clock generator;
   wherein the clock generator is selectively enabled in response to at least a signal level at the output of the second input buffer.

3. The apparatus of claim 2, further comprising:
   a third input buffer having an input connected to a clock enable signal line and having an output connected to the clock generator;
   wherein the clock generator is selectively enabled in response to at least the signal level at the output of the second input buffer and a signal level at the output of the third input buffer.

4. The apparatus of claim 3, wherein the output of the second input buffer and the output of the third input buffer are connected to the clock generator through a combinatorial logic.

5. The apparatus of claim 4, wherein the third input buffer is an inverting buffer, and wherein the combinatorial logic is an OR gate.

6. The apparatus of claim 1, wherein the apparatus is configured to activate the output buffer when the clock generator is activated, and to deactivate the input buffer when the clock generator is activated.

7. The apparatus of claim 6, wherein the apparatus is further configured to deactivate the output buffer when the input buffer is activated.

8. An apparatus, comprising:
   an array of memory cells;
   a controller for performing an access operation on the array of memory cells;
   a selectively activated input buffer having an input connected to a clock signal line and having an output;
   a selectively activated clock generator for selectively generating an internal clock signal;
   a selectively activated output buffer having an input connected to receive the internal clock signal and having an output connected to the clock signal line; and
   a counter for counting pulses of the internal clock signal from the clock generator when the clock generator is activated and for counting pulses of an external clock signal from the output of the input buffer when the input buffer is activated, and for providing a value of the counter to the controller.

9. The apparatus of claim 8, wherein the controller is configured to pause the access operation at a designated point until the value of the counter matches a particular value.

10. The apparatus of claim 8, wherein, when the clock generator is activated, the clock generator is selectively enabled in response to at least a signal level on a clock signal enable line.

11. The apparatus of claim 10, wherein the clock signal enable line is connected to a node configured for connection to an external device, and wherein the clock signal enable line is further selectively connected to a voltage supply node.

12. The apparatus of claim 11, wherein the voltage supply node is configured to receive a reference potential.

13. The apparatus of claim 12, wherein the voltage supply node is a first voltage supply node, wherein the clock signal enable line is further selectively connected to a second voltage supply node configured to receive a positive supply voltage, and wherein the clock signal enable line is selectively connected to the second voltage supply node through a resistor.

14. The apparatus of claim 8, further comprising:
   wherein, when the clock generator is activated, the clock generator is selectively enabled in response to at least a signal level on a clock signal enable line; and
   wherein the controller is configured to pause the access operation at a designated point until the value of the counter matches a particular value and to change the signal level on the clock signal enable line to disable the clock generator in response to resuming the access operation when the value of the counter matches the particular value.

15. An apparatus, comprising:
   an array of memory cells;
   a controller for performing an access operation on the array of memory cells;
   an input buffer having an input connected to a clock signal line and having an output;
   a clock generator for selectively generating an internal clock signal;
   an output buffer having an input connected to receive the internal clock signal and having an output connected to the clock signal line; and
   a counter for counting pulses of a particular clock signal selected from a group consisting of the internal clock signal from the clock generator and an external clock signal from the output of the input buffer, for generating a plurality of count signals, and for providing the plurality of count signals to the controller;

wherein, for each counted pulse of the particular clock signal, the counter is configured to provide one count signal of the plurality of count signals having a first logic level and to provide each remaining count signal of the plurality of count signals having a second logic level different than the first logic level.

16. The apparatus of claim 15, wherein the counter is further configured to generate a repeated sequence of the count signals of the plurality of count signals having their respective first logic level once during each sequence.

17. The apparatus of claim 16, wherein the counter is further configured to selectively reset the repeated sequence to a particular count signal of the plurality of count signals in response to a control signal.

18. The apparatus of claim 15, wherein the controller is configured to pause the access operation at a designated point until a particular count signal of the plurality of count signals has the first logic level.

19. The apparatus of claim 15, wherein the apparatus is configured to activate the clock generator and the output buffer, and to deactivate the input buffer, in response to a command indicative of a desire for the apparatus to generate the internal clock signal and output the internal clock signal to the clock signal line.

20. The apparatus of claim 15, wherein the input buffer is a first input buffer, the apparatus further comprising:

a second input buffer having an input connected to a ready/busy control signal line and having an output; and a third input buffer having an input connected to a clock enable signal line and having an output;

wherein the clock generator is selectively enabled in response to at least a signal level at the output of the second input buffer and a signal level at the output of the third input buffer;

wherein the controller is configured to pause the access operation at a designated point until a particular count signal of the plurality of count signals has the first logic level; and wherein the controller is further configured to change a signal level of the clock enable signal line to change the signal level at the output of the third input buffer to disable the clock generator in response to resuming the access operation when the particular count signal of the plurality of count signals has the first logic level.

\* \* \* \* \*